United States Patent
Kim et al.

(10) Patent No.: US 9,588,335 B2
(45) Date of Patent: Mar. 7, 2017

(54) ELECTROWETTING DISPLAY DEVICE INCLUDING A STRENGTHENED HYDROPHOBIC LAYER

(71) Applicant: Amazon Technologies, Inc., Seattle, WA (US)

(72) Inventors: Myunghwan Kim, Yongin-si (KR); Byeong-Jin Lee, Yongin-si (KR); Sang-Il Kim, Suwon-si (KR)

(73) Assignee: Amazon Technologies, Inc., Seattle, WA (US)

( * ) Notice: Subject to any disclaimer, the term of this patent is extended or adjusted under 35 U.S.C. 154(b) by 259 days.

(21) Appl. No.: 13/688,810

(22) Filed: Nov. 29, 2012

(65) Prior Publication Data

US 2013/0250396 A1    Sep. 26, 2013

(30) Foreign Application Priority Data

Mar. 20, 2012    (KR) .................. 10-2012-0028374

(51) Int. Cl.
*G02B 26/00*    (2006.01)
*G02B 26/02*    (2006.01)

(52) U.S. Cl.
CPC .......... *G02B 26/005* (2013.01); *G02B 26/02* (2013.01)

(58) Field of Classification Search
CPC ........... G02F 1/167; G02F 2001/1676; G02F 2001/1678; G02B 26/005; G02B 26/0833
USPC ........................................ 359/290–298, 315
See application file for complete search history.

(56) References Cited

U.S. PATENT DOCUMENTS

| | | | |
|---|---|---|---|
| 7,755,582 B2 * | 7/2010 | Hagood et al. | 345/84 |
| 7,821,699 B1 * | 10/2010 | Lo et al. | 359/290 |
| 7,847,996 B2 | 12/2010 | Chen et al. | |
| 7,876,506 B2 | 1/2011 | Chen et al. | |
| 7,993,819 B2 | 8/2011 | Lo et al. | |
| 2009/0058840 A1 | 3/2009 | Lee et al. | |
| 2009/0141334 A1 * | 6/2009 | Dean | G02B 26/005 359/290 |

OTHER PUBLICATIONS

AGC's CYTOP, [retrieved on Aug. 6, 2015], Retrieved from the Internet: <URL:http://www.agc.com/kagaku/shinsei/cytop/en/about.html>.*

Drobny, Jiri George Technology of Fluoropolymers, [online], ISBN [retrieved on Aug. 6, 2015] p. 138.*

(Continued)

*Primary Examiner* — Bumsuk Won
*Assistant Examiner* — Tamara Y Washington
(74) *Attorney, Agent, or Firm* — Lee & Hayes, PLLC

(57) ABSTRACT

An electrowetting display device includes a base substrate, a hydrophobic layer disposed on the base substrate and including at least about 49 atomic percent (at %) of fluorine atoms in a surface thereof, a wall disposed on the base substrate which partitions a pixel area, and an electrowetting layer that includes a first fluid and a second fluid, which are disposed in the pixel area and are immiscible with each other. The second fluid has an electrical conductivity or a polarity. The electrowetting display device further includes an electronic device is configured to apply an electric field to the electrowetting layer to control the electrowetting layer.

19 Claims, 16 Drawing Sheets

(56) References Cited

OTHER PUBLICATIONS

Fortin, Jeffery B., and Lu, Toh-Ming, Chemical Vapor Deposition Polymerization: The Growth and Properties of Parylene Thin Films [online], ISBN 978-1-4757-3901-5.*
Chemical Vapor Deposition Polymerization: The Growth and Properties of Parylene Thin Films [online] https://books.google.com/books?hl=en&lr=&id=ISTeEAPm1xwC&oi=fnd&pg=PR9&dq=Chemical+Vapor+Deposition+Polymerization,+Page+89,+By+Jeffrey+B.+Fortin,+Toh-Ming+Lu&ots=eaBgxy3MAW&sig=9tA9tP04fxb8JfE9MUFsJwNDK.*

* cited by examiner

ELECTROWETTING DISPLAY DEVICE INCLUDING A STRENGTHENED HYDROPHOBIC LAYER

CROSS-REFERENCE TO RELATED APPLICATION

This U.S. non-provisional patent application claims priority under 35 U.S.C. §119 to Korean Patent Application No. 10-2012-0028374, filed on Mar. 20, 2012, the disclosure of which is hereby incorporated by reference herein in its entirety.

1. Technical Field

The present disclosure relates to an electrowetting display device using an electrowetting effect and a method of manufacturing the electrowetting display device.

2. Discussion of the Related Art

Various display devices, such as, for example, a liquid crystal display (LCD), a plasma display panel (PDP), an organic light emitting display (OLED), a field effect display (FED), an electrophoresis display (EPD), an electrowetting display (EWD), etc., are being used as flat panel display devices.

Among these display devices, the electrowetting display may be configured to apply a voltage to an aqueous liquid electrolyte to change a surface tension of the aqueous liquid electrolyte, and thus the electrowetting display may reflect or transmit light from the outside, thereby displaying desired images.

SUMMARY

Exemplary embodiments of the present invention provide an electrowetting display device having increased display quality.

Exemplary embodiments of the present invention provide a method of manufacturing an electrowetting display device having increased display quality.

Exemplary embodiments of the present invention provide an electrowetting display device which includes a base substrate, a hydrophobic layer disposed on the base substrate and including at least about 49 at % of fluorine atoms in a surface thereof, a wall disposed on the base substrate which partitions a pixel area, an electrowetting layer that includes a first fluid and a second fluid, which are disposed in the pixel area and are immiscible with each other. The second fluid has an electrical conductivity or a polarity. The electrowetting display device further includes an electronic device configured to apply an electric field to the electrowetting layer to control the electrowetting layer.

The hydrophobic layer includes an amorphous fluorine compound including at least one of —$C_xF_y$-, $C_xF_yH_z$-, —$C_xF_yC_zH_p$-, —$C_xF_yO$—, or —$C_xF_yN(H)$—, where each of x, y, x, p is an integer number which is no less than 1. The hydrophobic layer includes a planarization portion substantially parallel to an upper surface of the base substrate and an edge portion disposed at side portions of the planarization portion and inclined with respect to the wall. The wall is disposed on the hydrophobic layer, or the hydrophobic layer is provided in the pixel area.

Exemplary embodiments of the present invention provide an electrowetting display device which includes a base substrate, a hydrophobic layer disposed on the base substrate, a wall disposed on the base substrate which partitions a pixel area, and an electrowetting layer that includes a first fluid and a second fluid, which are disposed in the pixel area and are immiscible with each other. The second fluid has an electrical conductivity or a polarity. The electrowetting display device further includes an electronic device disposed on the base substrate which is configured to control the electrowetting layer.

The hydrophobic layer includes a planarization portion substantially parallel to an upper surface of the base substrate and an edge portion disposed at side portions of the planarization portion and inclined with respect to the wall.

Exemplary embodiments of the present invention provide a method of manufacturing an electrowetting display device. The method includes forming a hydrophobic layer on a base substrate, forming a wall on the base substrate to partition a pixel area, reflowing the hydrophobic layer at a temperature higher than a glass transition temperature of the hydrophobic layer to form a second hydrophobic layer, forming an electrowetting layer in the pixel area, and forming an electronic device that controls the electrowetting layer. The hydrophobic layer is plasma-treated before the wall is formed.

Exemplary embodiments of the present invention provide an electrowetting display device which includes a base substrate, a hydrophobic layer disposed on the base substrate, a wall disposed on the base substrate which partitions a pixel area, an electrowetting layer which includes a first fluid and a second fluid. The first fluid and the second fluid are disposed in the pixel area and are immiscible with each other, and the second fluid has an electrical conductivity or a polarity. The electrowetting display device further includes an electronic device disposed on the base substrate and on a lower surface of the electrowetting layer is configured to control the electrowetting layer. In addition, the electrowetting display device further includes an insulating layer covering the electronic device.

The hydrophobic layer includes a planarization portion substantially parallel to an upper surface of the base substrate and an edge portion disposed at side portions of the planarization portion and inclined with respect to the wall. The edge portion of the hydrophobic layer makes direct contact with the wall and a contact angle between the hydrophobic layer and the wall is smaller than a right angle. Moreover, a height of an end portion of the edge portion of the hydrophobic layer is lower than a height of the wall.

According to the above, the display quality of the electrowetting display device may be increased. The non-closing defective of the electrowetting display device may be reduced, so that the electrowetting display device may readily display black gray scale.

BRIEF DESCRIPTION OF THE DRAWINGS

Exemplary embodiments of the present invention can be understood in more detail from the following detailed description when taken in conjunction with the accompanying drawings wherein.

DETAILED DESCRIPTION

Figure 1:
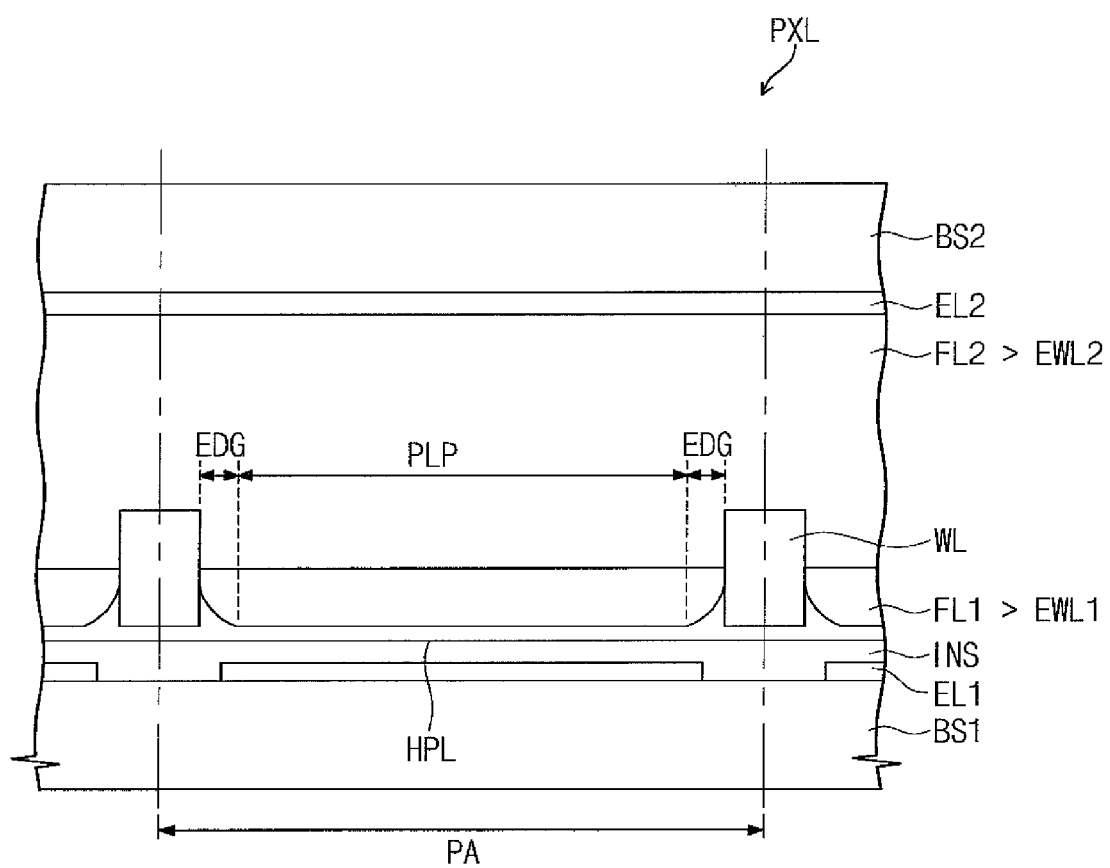
FIG. 1 is a cross-sectional view showing a portion of an electrowetting display device according to an exemplary embodiment of the present invention.

It will be understood that when an element or layer is referred to as being "on", "connected to" or "coupled to" another element or layer, it can be directly on, connected or coupled to the other element or layer or intervening elements or layers may be present. Like numbers refer to like elements throughout. As used herein, the term "and/or" includes any and all combinations of one or more of the associated listed items. In the drawings, the thickness of layers, films, panels, regions, etc., may be exaggerated for clarity.

As used herein, the singular forms, "a", "an" and "the" are intended to include the plural forms as well, unless the context clearly indicates otherwise.

Hereinafter, an exemplary embodiment of the present invention will be explained in detail with reference to the accompanying drawings.

FIG. 1 is a cross-sectional view showing a portion of an electrowetting display device according to an exemplary embodiment of the present invention. The electrowetting display device includes a plurality of pixels PXL, and one of the pixels PXL has been shown in FIG. 1. In FIG. 1, a range of the pixel PXL has been represented by two dotted lines.

Referring to FIG. 1, each pixel PXL includes, for example, a first base substrate BS1, a second base substrate BS2, a wall WL, a hydrophobic layer HPL, and an electrowetting layer EWL.

The electrowetting display device includes a front surface on which an image is displayed and a rear surface opposite to the front surface. A viewer may perceive the image displayed on the electrowetting display device in front of the front surface. In the present exemplary embodiment, an outer surface of the second base substrate BS2 (e.g., an upper surface of the second base substrate BS2 in FIG. 1) is referred to as the front surface or the upper surface and an opposite surface to the front or upper surface is referred to as the rear surface or a lower surface. However, exemplary embodiments of the present invention are not limited to the above-mentioned position of the front surface and the rear surface. That is, the position of the front and rear surfaces may be changed depending on an operation mode of the electrowetting display device, such as, for example, a reflective mode, a transmissive mode, a transflective mode, etc. The electrowetting display device may be, for example, a segmented display type in which the image is built up of segments. The electrowetting display device may be, for example, an active matrix driving display device or a passive matrix driving display device.

Each of the first base substrate BS1 and the second base substrate BS2 is formed in an inseparable single body to be commonly shared by the pixels PXL or formed in plural numbers to be used as a portion of each pixel PXL. The first base substrate BS1 and/or the second base substrate BS2 may be, but are not limited to, a transparent insulator or a polymer, such as glass, plastic, etc. When the first base substrate BS1 and/or the second base substrate BS2 is a plastic substrate, the first base substrate BS1 and/or the second base substrate BS2 may be formed of, for example, polyethylene terephthalate (PET), fiber reinforced plastic (FRP), or polyethylene naphthalate (PEN). In addition, the first base substrate BS1 and/or the second base substrate BS2 may be rigid or flexible.

The wall WL is disposed on the first base substrate BS1 to define a space surrounded by the first base substrate BS1 and the wall WL. The space may be, for example, a pixel area PA corresponding to each pixel PXL. Accordingly, the area of the pixel area PA may be limited by the wall WL, and the area of the pixel area PA has been represented by dotted lines. In the present exemplary embodiment, the wall WL is formed on the first base substrate BS1 and the first base substrate BS1 and the wall WL define the pixel area PA, but exemplary embodiments are not limited thereto or thereby. For instance, the pixel area PA may be defined by the first base substrate BS1, the second base substrate BS2, and the wall WL.

The first and second electrowetting layers EWL1 and EWL2 are provided in the pixel area PA. The first electrowetting layer EWL1 may include, for example, a first fluid FL1 and the second electrowetting layer EWL2 may include, for example, a second fluid FL2. The first and second fluids FL1 and FL2 are immiscible with each other. The second fluid FL2 has, for example, an electrical conductivity or a polarity. For example, in an embodiment, the second fluid FL2 may be a polar liquid aqueous solution (Aq) such as water or a salt solution such as a solution of sodium chloride or potassium chloride in water. In the present exemplary embodiment, the second fluid FL2 includes, for example, potassium chloride or sodium chloride solution (Aq) dissolved in a mixture of water and ethyl alcohol. The second fluid FL2 may be transparent or have a color. As an example, the second fluid FL2 may have a white color to absorb or reflect light from the outside. The first fluid FL1 has, for example, a non-electrical conductivity. For example, in an embodiment, the first fluid FL1 may include an alkane like hexadecane, decane, dodecane, tetradecane, or an oil like silicone oil.

The first fluid FL1 may absorb at least a portion of the optical spectrum. The first fluid FL1 may transmit a portion of the optical spectrum, so the first fluid FL1 displays a color. The first fluid FL1 may include, for example, pigments or dyes to display the color. According to an exemplary embodiment, the first fluid FL1 may be tinged with, for example, black. In this case, the first fluid FL1 may absorb substantially the entire optical spectrum of visible light. In addition, the second fluid FL2 may reflect the optical spectrum.

Alternatively, in an embodiment the first fluid FL may include other color dyes or pigments other than a black color, so that the display apparatus may display various colored images. For example, in an embodiment, the first fluid FL may include other dyes or pigments of primary colors such as red, green, cyan, magenta, blue, or yellow.

The hydrophobic layer HPL is disposed on the first base substrate BS1. In the present exemplary embodiment, as the wall WL is disposed on the hydrophobic layer HPL, the hydrophobic layer HPL is disposed between the first base substrate BS1 and the wall WL when viewed in a cross-sectional view. The hydrophobic layer HPL may be formed, for example, in a single body to cover the pixels PXL. Meanwhile, an insulating layer INS is disposed between the first base substrate BS1 and the hydrophobic layer HPL, and the insulating layer INS may have, for example, a multi-layer structure, e.g., a double-layer structure, or may be omitted.

The hydrophobic layer HPL may have, for example, permeability or reflexibility. When the hydrophobic layer HPL has reflexibility, light from the outside may be reflected by the hydrophobic layer HPL. In addition, the hydrophobic layer HPL may have, for example, a white color or reflect a portion of the light corresponding to a specific wavelength to have a specific color. The hydrophobic layer HPL includes, for example, a material having hydrophobicity, e.g., a compound of fluorine atoms. The material of the hydrophobic layer HPL is formed of compound which contains, for example, about 49 atomic percent (at %) of fluorine atoms or more in its surface to allow the surface to have the hydrophobicity. The compound of the hydrophobic layer HPL may be, for example, a polymer compound represented by the following chemical formulas, such as —CxFy-, —CxFyCzHp-, —CxFyO—, —CxFyN(H)—, etc., where each of x, y, x, p is an integer number equal to or larger than 1), or an amorphous fluorine compound, such as, for example, copolymers of tetrafluoroethylene (TFE) and perfluro-2,2 dimethyl 1, 3 dioxide (PDD), sold under the brand name TEFLON® AF 1600 which is a registered trademark of the E.I. DuPont de Nemours and Company Corporation, 101 West 10th St., Wilmington, Del. 19898). Alternatively, other low surface energy polymers such as, for example, parylene may be used to form the hydrophobic layer HPL In the present exemplary embodiment, the term of "surface of the hydrophobic layer HPL" is used to define a thin layer having, for example, a thickness of about 50 angstroms to about 100 angstroms from the upper surface of the hydrophobic layer HPL to the lower surface of the hydrophobic layer HPL.

The first fluid FL1 should have a hydrophobicity sufficient to be attached to the hydrophobic layer HPL when compared with the second fluid FL2. The hydrophobic layer HPL contains, for example, about 49 at % of fluorine atoms in the surface thereof, and thus the first fluid FL1 has wettability higher than that of the second fluid FL2 with respect to the surface of the hydrophobic layer HPL. The wettability indicates a relative affinity of fluid against a surface of a solid. For example, in the present exemplary embodiment, a contact angle of water with respect to the hydrophobic layer HPL is about 100° or more, and the hydrophobic layer HPL has a surface tension of about 16 dyne/cm or more.

The hydrophobic layer HPL includes, for example, a planarization portion PLP substantially parallel to the upper surface of the first base substrate BS1 and an edge portion EDG disposed at side portions of the planatization portion PLP and inclined with respect to the wall WL. The edge portion EDG is disposed adjacent to the wall WL and directly makes contact with the wall WL. The contact angle between the hydrophobic layer HPL and the wall WL is, for example, smaller than a right angle. An end portion of the edge portion EDG of the hydrophobic layer HPL is positioned, for example, at a height higher than an end portion of the planarization portion PLP when viewed in a cross-sectional view. In the present exemplary embodiment, the term of "height" is used, for example, to indicate a distance from an upper surface of a lower layer disposed under a specific layer. The height of the end portion of the edge portion EDG is, for example, lower than that of the wall WL and larger than about $1/100$ of the height of the wall WL. In addition, the height of the end portion of the edge portion EDG is, for example, smaller than about $99/100$ of the height of the wall WL.

Each pixel PXL includes, for example, an electronic device that applies an electric field to the first and second electrowetting layers EWL1 and EWL2 to control the first and second electrowetting layers EWL1 and EWL2. The electronic device includes, for example, a first electrode EL1 disposed on the first base substrate BS1, a switching device (not shown) connected to the first electrode EL1, and a second electrode EL2 disposed on the second base substrate BS2. The first electrode EL1 is disposed between the first base substrate BS1 and the hydrophobic layer HPL, and an insulating layer INS is disposed between the first base substrate BS1 and the first electrode EL1.

The first electrode EL1 is separated from the first and second electrowetting layers EWL1 and EWL2 by the hydrophobic layer HPL. The first electrode EL1 may be provided in a desired shape. The first electrode EL1 is applied with a voltage signal by the switching device. The second electrode EL2 may be formed, for example, in a single body to cover all the pixels PXL. Although not shown in figures, in the case that the second electrode EL2 is divided into a plurality of second electrodes EL2, which respectively correspond to the pixels PXL, the second electrodes EL2 may be electrically connected to each other by the second fluid FL2.

In the present exemplary embodiment, the first electrode EL1 and the second electrode EL2 are respectively disposed on the first base substrate BS1 and the second base substrate BS2, but exemplary embodiments of the present invention are not limited thereto or thereby. For instance, all the first and second electrodes EL1 and EL2 may be disposed on the first base substrate BS1. In this case, the second electrode EL2 may be provided on at least one side portion of the first electrode EL1 and electrically insulated from the first electrode EL1.

The pixel PXL is controlled by a voltage or potential difference applied between the first electrode EL1 and the second electrode EL2. The first electrode EL1 disposed on the first base substrate BS1 is connected to the switching device.

The movement of the first fluid FL1 may be limited in each pixel PXL by the wall WL of the pixel PXL. The wall WL may have hydrophilicity to push out the first fluid FL1. In the present exemplary embodiment, the wall WL extends in, for example, a direction from the first base substrate BS1 to the second base substrate BS2. However, exemplary embodiments of the present invention are not limited to the above position for the wall WL. For example, alternatively, in an embodiment, the wall WL may extend in a direction from the second base substrate BS2 to the first base substrate BS1.

The pixel PXL may be in an ON-state when the voltage difference, which is not zero, is applied to the first electrode FL1 and the second electrode FL2. An electrostatic force caused by the voltage difference may move the second fluid FL2 to the first electrode EL1, and thus the first fluid FL1 may be pushed out from at least a portion of the hydrophobic layer HPL to the wall WL surrounding the hydrophobic layer HPL. When the first fluid FL1 is completely pushed out, the first fluid FL1 may have a drop shape as shown by the dotted line. Accordingly, the hydrophobic layer HPL of the pixel PXL is exposed through the first fluid FL1. When the voltage applied to the pixel PXL returns to about zero volts, the pixel PXL may return to an OFF-state, so the first fluid FL1 covers the hydrophobic layer HPL again. The first fluid FL1 may thus serve as an optical switch that is able to be electrically controlled in each pixel PXL.

Figure 2:
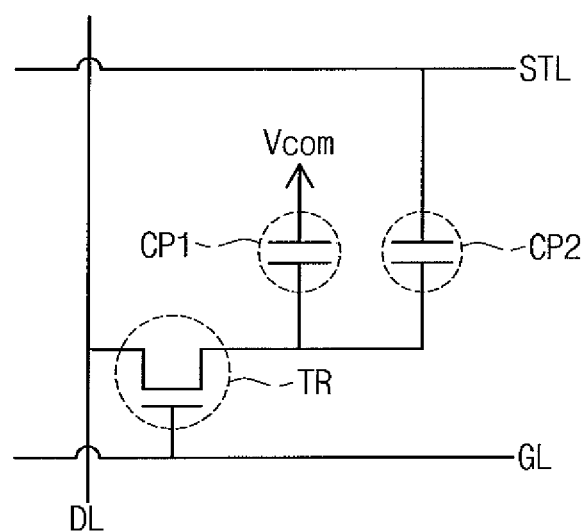
FIG. 2 is circuit diagram showing a switching device in an active matrix pixel circuit.

FIG. 2 is circuit diagram showing a switching device in an active matrix pixel circuit. In the present exemplary embodiment, each pixel may include one or more transistors, but FIG. 2 shows that each pixel includes a corresponding one transistor.

The switching device includes, for example, a transistor TR, first and second capacitors CP1 and CP2, and connection lines GL and DL.

The transistor TR includes, for example, a gate electrode, a source electrode, and a drain electrode. The connection lines include, for example, a gate line GL and a data line DL, which are connected to the transistor TR. The gate electrode is connected to the gate line GL, the source electrode is connected to the data line DL, and the drain electrode is connected to the first and second capacitors CP1 and CP2. The first capacitor CP1 is, for example, an electrowetting capacitor configured to include a first electrode, a second electrode, and a fluid provided between the first electrode and the second electrode. The second electrode is connected to a common voltage Vcom applied to a second fluid making contact with the second electrode. The second capacitor CP2 is, for example, a storage capacitor configured to include the drain electrode (and/or first electrode), a storage electrode STE, and an insulating layer disposed between the two electrodes. The storage electrode STE is connected to a storage line STL.

The voltage applied to the first electrode is set by the data line DL while the switching device is operated. When a gate signal is applied to the gate line GL, the transistor is turned on, and thus the voltage applied to the data line DL is applied to the first and second capacitors CP1 and CP2. After the data voltage is applied to the first electrode, the data voltage remains in the capacitors due to a coupling capacitance of the first and second capacitors CP1 and CP2 so as to drive the pixel until the voltage is refreshed.

Figure 3:
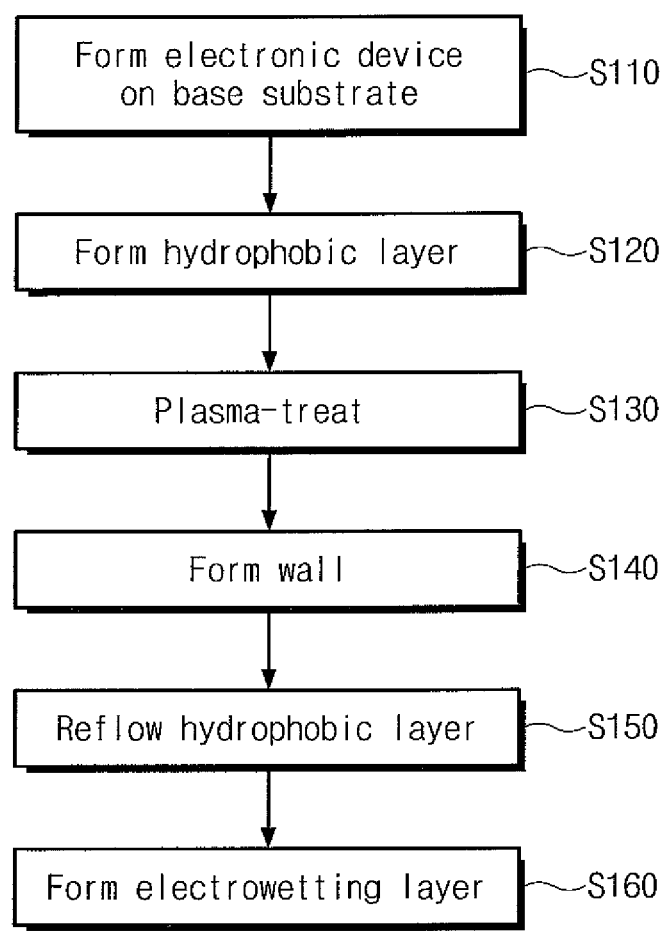
FIG. 3 is a flowchart showing a method of manufacturing the electrowetting display device shown in FIG. 1 according to an exemplary embodiment of the present invention.

FIG. 3 is a flowchart showing a method of manufacturing the electrowetting display device shown in FIG. 1 according to an exemplary embodiment of the present invention. FIGS. 4A to 4F are cross-sectional views showing a method of manufacturing the electrowetting display device shown in FIG. 1 according to an exemplary embodiment of the present invention.

Referring to FIG. 3, the electrowetting display device of FIG. 1 is manufactured by forming the electronic device on the base substrate, forming the hydrophobic layer HPL on at least a portion of the base substrate, plasma-treating the hydrophobic layer HPL, forming the wall WL on the hydrophobic layer HPL, reflowing the hydrophobic layer HPL, and forming the first electrowetting layer EWL1 and the second electrowetting layer EWL2.

Hereinafter, the method of manufacturing the electrowetting display device of FIG. 1 will be described in detail with reference to FIGS. 1, 3 and 4A to 4F.

Figure 4A:
FIGS. 4A to 4F are cross-sectional views showing a method of manufacturing the electrowetting display device shown in FIG. 1 according to an exemplary embodiment of the present invention.

Referring to FIGS. 3 and 4A, the base substrate is prepared and the electronic device is formed on the base substrate (S110).

The base substrate includes, for example, the first base substrate BS1 and the second base substrate BS2. The electronic device includes, for example, the first electrode EL1, the second electrode EL2, and the switching device. In FIG. 4A, the first electrode EL1 is formed on the first base substrate BS1. In FIG. 4A, the second base substrate BS2, the second electrode EL2, and the switching device are omitted.

The insulating layer INS is formed on the first base substrate BS1 on which the first electrode EL1 is formed, and thus the first electrode EL1 is covered by the insulating layer INS.

Figure 4B:

Referring to FIGS. 3 and 4B, the hydrophobic layer HPL is formed on the first base substrate BS1 (S120). The hydrophobic layer HPL is formed by using, for example, a compound containing fluorine atoms. The compound may be, for example, a polymer compound represented by the following chemical formulas, such as —CxFy—, CxFyHz-, —CxFyCzHp-, —CxFyO—, —CxFyN(H)—, etc., (where each of x, y, x, p is an integer number equal to or larger than 1), or the amorphous fluorine compound represented by the following chemical formula 1, such as, for example, copolymers of tetrafluoroethylene (TEE) and perfluro-2,2 dimethyl 1,3 dioxide (PDD), sold under the brand name TEF-LON® AF 1600 which is a registered trademark of the E.I. DuPont de Nemours and Company Corporation, 101 West 10$^{th}$ St., Wilmington, Del. 19898). Alternatively, other low surface energy polymers such as, for example, parylene may be used to form the hydrophobic layer HPL. In the chemical formal 1, m and n is a natural number.

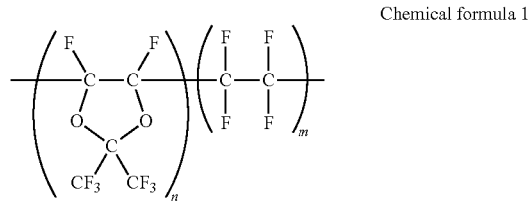

Chemical formula 1

Then, although not shown in figures, the hydrophobic layer HPL is patterned. The patterning is performed, for example, to expose a portion of the electronic device, e.g., a portion of the connection line, and thus external lines may be connected to the electronic device.

Figure 4C:
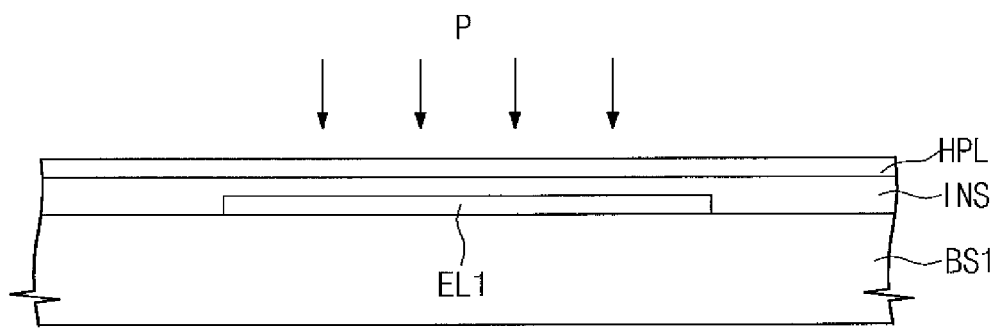

For example, referring to FIGS. 3 and 4C, a plasma treatment is performed on the hydrophobic layer HPL (S130). The plasma treatment is performed to allow the surface of the hydrophobic layer HPL having hydrophobicity to temporarily have hydrophilicity. In the case that the hydrophobic layer HPL maintains its hydrophobicity, an adhesive property between the hydrophobic layer HPL and the wall WL may be poor. Accordingly, when the surface of the hydrophobic layer HPL is plasma-treated to have the hydrophilicity as shown in FIG. 4C, the adhesive property between the wall WL and the hydrophobic layer HPL may be increased.

Figure 4D:
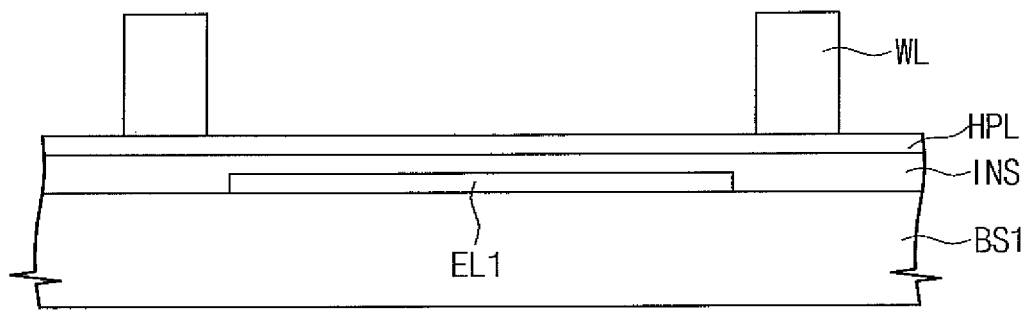

Referring to FIGS. 3 and 4D, the wall WL is formed on the plasma-treated hydrophobic layer HPL (S140). The wall WL may be formed of, for example, a photosensitive organic material, such as a photoresist, or a heat curable organic material. The wall WL, for example, may include an epoxy compound represented by the following chemical formula 2.

Chemical formula 2

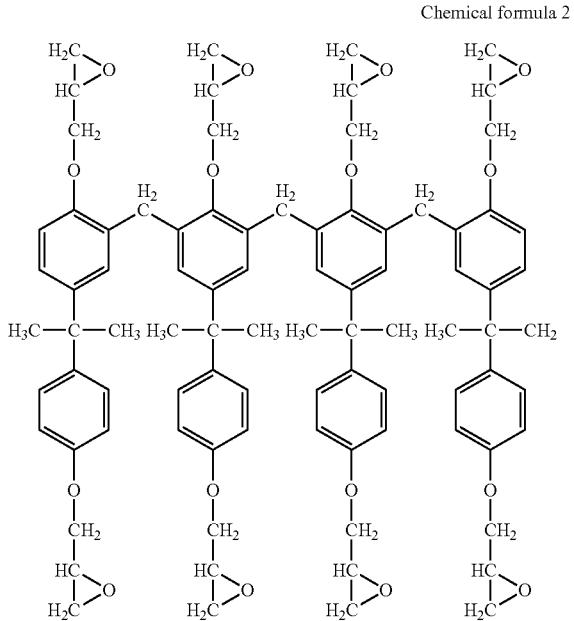 [SMILES: CC(C)(c1ccc(OCC2CO2)cc1)c1ccc(OCC2CO2)c(Cc2cc(C(C)(C)c3ccc(OCC4CO4)cc3)cc(Cc3cc(C(C)(C)c4ccc(OCC5CO5)cc4)cc(Cc4cc(C(C)(C)c5ccc(OCC6CO6)cc5)ccc4OCC4CO4)c3OCC3CO3)c2OCC2CO2)c1]

In the case that the wall WL is formed of the photosensitive organic material, the wall WL may be formed by, for example, a photolithography process including exposure and development processes. For example, the photosensitive organic material is patterned through the photolithography process and cured through a baking process, thereby forming the wall WL with the photosensitive organic material. The hydrophilic portion of the hydrophobic layer HPL may be removed by, for example, the development process of the photolithography process, but exemplary embodiments of the present invention are not limited to the development process. That is, the hydrophilic portion of the hydrophobic layer HPL may be removed separately using, for example, a washing solution or an etchant.

Figure 4E:
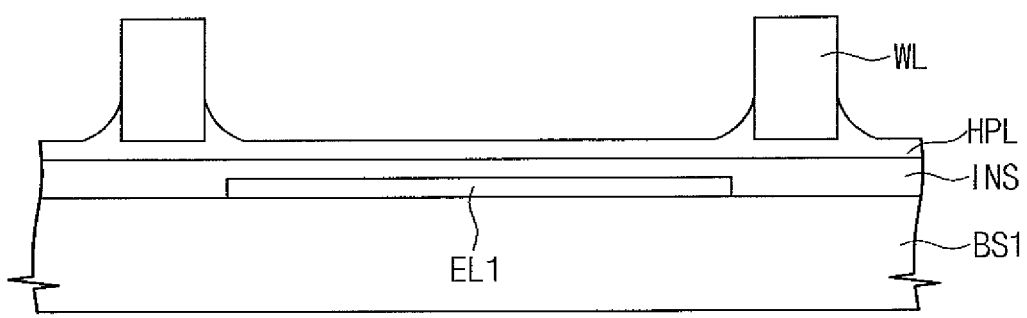

Referring to FIGS. 3 and 4E, after the wall WL is formed, the hydrophobic layer HPL is, for example, reflowed (S150). Residues and hydrophilic functional groups (e.g., —OH, —CHO, —COOH, etc.) on the hydrophobic layer HPL are removed or relocated into the inside of the hydrophobic layer HPL through the reflowing process, so that the hydrophobicity on the surface of the hydrophobic layer HPL may be increased. The residues and hydrophilic functional groups are generated in the plasma treatment process and the process of forming the wall WL. The reflow process is performed, for example, by heating the hydrophobic layer HPL at a temperature higher than a glass transition temperature Tg of the material for the hydrophobic layer HPL. The reflow temperature of the hydrophobic layer HPL is in a range of, for example, about 160° C. to about 280° C. When the hydrophobic layer HPL is formed of the organic material represented by the chemical formula 1, the reflow process is performed at the reflow temperature of, for example, about 160° C. or more. For example, the reflow process may be performed at the reflow temperature of about 220° C. for about one hour. In the reflow process, the atoms in the hydrophobic layer HPL may be rearranged so as to allow an interfacial energy between the hydrophobic layer HPL and air to be minimized. Thus, the hydrophilic functional groups may enter inside the hydrophobic layer HPL and hydrophobic functional groups, e.g., fluorine (F), may come up to the surface. As a result, the hydrophobicity of the hydrophobic layer HPL may be strengthened again.

In the reflow process, a creep phenomenon, in which the surface of the edge portion EDG slides upward along the wall WL as it is closer to the wall WL, may occur when the reflow temperature is equal to or higher than the glass transition temperature and a surface tension difference between the hydrophobic layer HPL and the wall WL is equal to or higher than gravity. In this case, the height of the end portion of the edge portion EDG may be varied depending on, for example, the temperature, the process time, and the surface tension of the wall WL and the hydrophobic layer HPL of the reflow process. For example, when the hydrophobic layer HPL is represented by the chemical formula 1, the surface tension of the hydrophobic layer HPL is about 17 dyne/cm, and when the wall WL is represented by the chemical formula 2, the surface tension of the wall WL is about 45 dyne/cm.

Figure 5A:
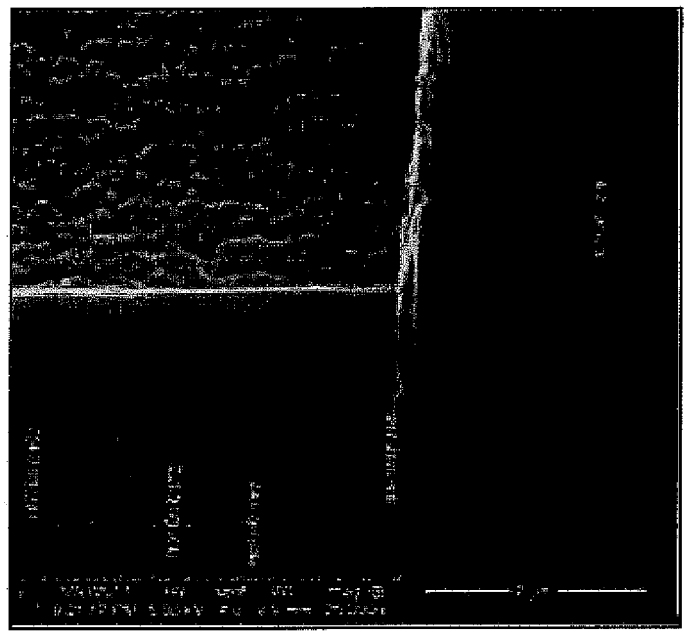
FIGS. 5A to 5D are SEM images showing a hydrophobic layer and a wall.
Figure 5B:
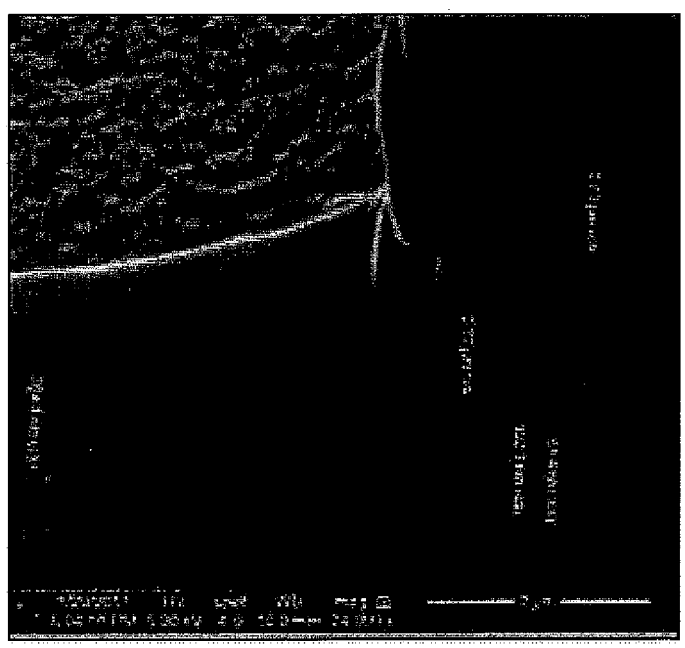
Figure 5C:
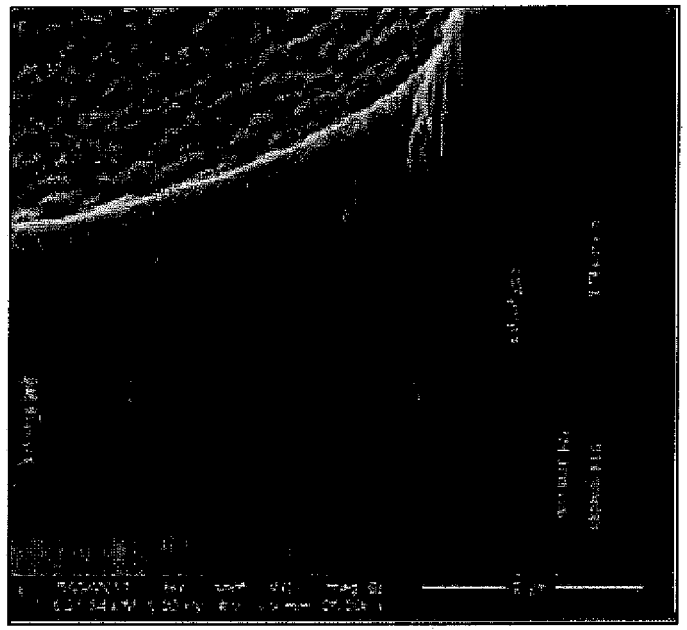
Figure 5D:
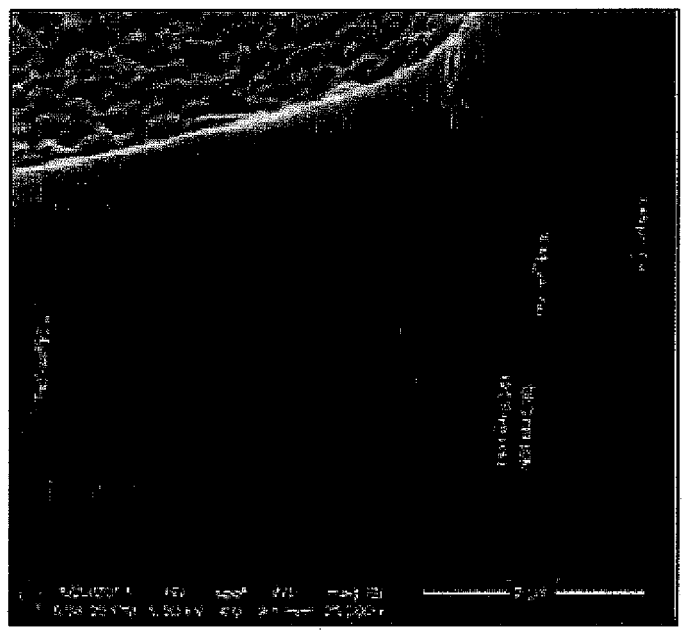

FIGS. 5A to 5D are SEM images showing the hydrophobic layer HPL and the wall WL. For example, FIG. 5A shows the hydrophobic layer HPL and the wall WL before the reflow process is performed on the hydrophobic layer HPL and the wall WL, FIG. 5B shows the hydrophobic layer HPL and the wall WL after the reflow process is performed on the hydrophobic layer HPL and the wall WL at the temperature of about 220 degrees, FIG. 5C shows the hydrophobic layer HPL and the wall WL after the reflow process is performed on the hydrophobic layer HPL and the wall WL at the temperature of about 240 degrees, and FIG. 5D shows the hydrophobic layer HPL and the wall WL after the reflow process is performed on the hydrophobic layer HPL and the wall WL at the temperature of about 260 degrees. As shown in FIGS. 5A to 5D, the creep phenomenon of the edge portion EDG of the hydrophobic layer HPL may occur when the reflow process is performed on the hydrophobic layer HPL and the wall WL.

Figure 4F:
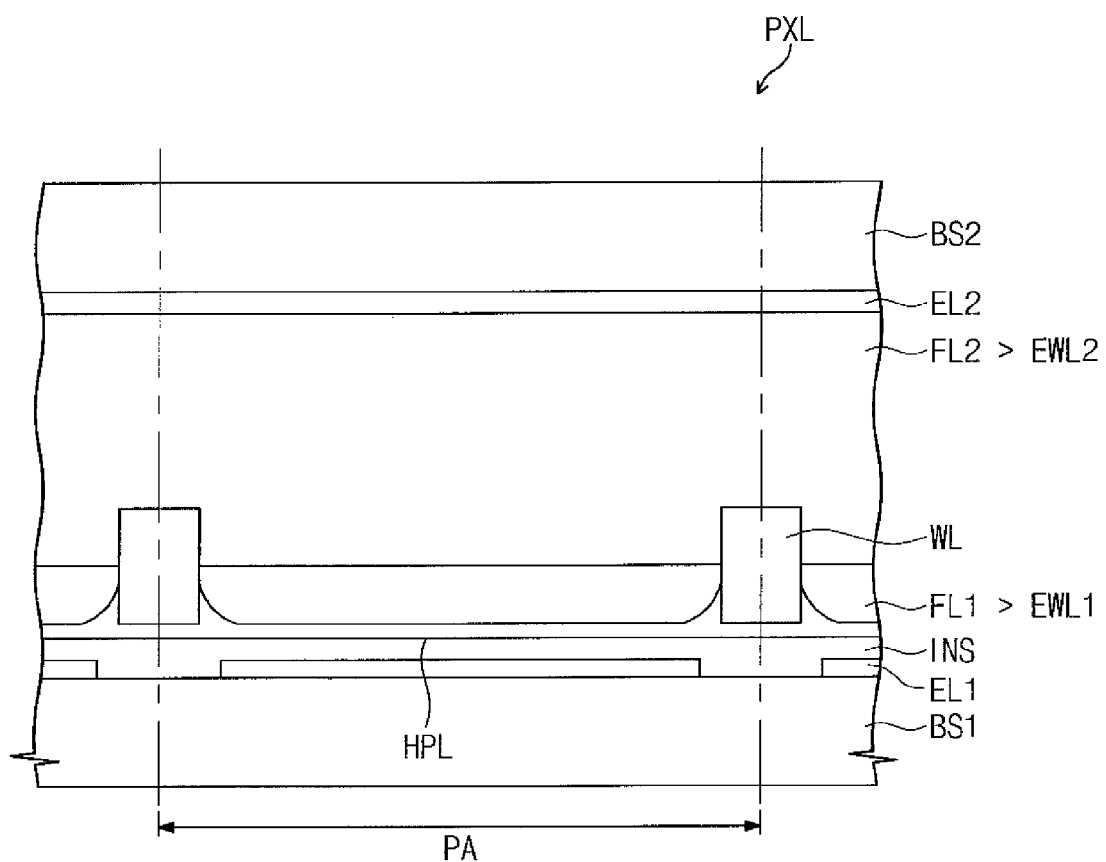

Referring to FIGS. 3 and 4F, the first and second electrowetting layers EWL1 and EWL2 are formed between the first base substrate BS1 and the second base substrate BS2 (S160). The first electrowetting layer EWL1 may include, for example, the first fluid FL1 and the second electrowetting layer EWL2 may include, for example, the second fluid FL2. In the present exemplary embodiment, the first fluid FL1 is formed in the display area defined by the wall WL.

The electrowetting display device manufactured by the above-mentioned method may reduce a non-closing defective when the electrowetting display device is operated.

The non-closing defective indicates that the first fluid FL1 does not completely cover the hydrophobic layer HPL when the voltage is applied to or not applied to each pixel and a black state is improperly represented. The non-closing defective may be caused by the residues generated during the processes performed after the hydrophobic layer HPL is formed or the hydrophilic functional groups not removed from the hydrophobic layer HPL. For example, the non-closing defective may be caused by hydrophilic functional groups generated by a reaction between the hydrophilic functional groups generated during the plasma treatment on the hydrophobic layer HPL and functional groups of a material for the wall. For instance, when the hydrophobic layer HPL represented by the chemical formula 1 is plasma-treated, —OH group or —COOH group may be adsorbed onto a tip of the polymer and —OH group or —COOH group may react with an epoxy group of the wall represented by the chemical formula 2, thereby causing other hydrophilic functional groups.

According to the present exemplary embodiment, the hydrophobicity of the hydrophobic layer HPL may be strengthened by reflowing the hydrophobic layer HPL to which the hydrophilic functional groups are adsorbed. That is, during the reflow process, the atoms in the hydrophobic layer HPL may be rearranged so as to allow the interfacial energy between the hydrophobic layer HPL and air to be minimized. Thus, the hydrophilic functional groups may enter inside the hydrophobic layer HPL and hydrophobic functional groups, e.g., fluorine (F), may come up to the surface of the hydrophobic layer HPL. As a result, the hydrophobicity of the hydrophobic layer HPL may be strengthened and the non-closing defective may be reduced.

Table 1 shown below illustrates the atom content in the hydrophobic layer HPL before and after performing the reflow process when the hydrophobic layer HPL and the wall are formed. In Examples 1 to 5, exposure and baking conditions are partially changed, but the hydrophobic layer HPL and the wall WL are formed under the same experimental conditions.

TABLE 1

| Examples | Atom content before reflow process | | | Atom content after reflow process | | |
| --- | --- | --- | --- | --- | --- | --- |
|  | C | O | F | C | O | F |
| 1 | 47.98 | 13.07 | 38.95 | 36.42 | 11.74 | 51.83 |
| 2 | 45.79 | 13.14 | 41.07 | 35.59 | 11.74 | 52.66 |
| 3 | 47.23 | 11.71 | 41.05 | 35.96 | 11.51 | 52.53 |
| 4 | 50.23 | 14.47 | 35.30 | 36.95 | 11.44 | 51.61 |
| 5 | 49.61 | 13.51 | 36.88 | 37.26 | 11.44 | 51.30 |
| 8 | 45.84 | 13.47 | 40.69 | 38.32 | 12.64 | 49.04 |
| 9 | 48.31 | 13.3 | 38.39 | 38.61 | 11.92 | 49.47 |
| 10 | 45.77 | 13.48 | 40.74 | 38.23 | 12.01 | 49.76 |
| 11 | 51.16 | 14.72 | 34.12 | 38.38 | 12.13 | 49.49 |
| 12 | 48.79 | 14.02 | 37.19 | 36.57 | 11.03 | 52.39 |

Referring to Table 1, in the case that the reflow process is not performed after the hydrophobic layer HPL and the wall WL are formed, the content of fluorine (F) in the surface of the hydrophobic layer HPL is about 35 at % to about 41 at % and the content of oxygen (O) in the surface of the hydrophobic layer HPL is about 11 at % to about 15 at %. In comparison, in the case that the reflow process is performed after the hydrophobic layer HPL and the wall WL are formed, the content of F in the surface of the hydrophobic layer HPL is about 49 at % to about 53 at % and the content of O in the surface of the hydrophobic layer HPL is about 11 at % to about 13 at %. That is, when the reflow process is performed after the hydrophobic layer HPL and the wall WL are formed, the content of F may be significantly increased and the relative content of O to F may be significantly decreased. This means that when the reflow process is performed after the hydrophobic layer HPL and the wall WL are formed, the content of F may be significantly increased in the surface of the hydrophobic layer HPL and the hydrophobicity of the hydrophobic layer HPL may be significantly strengthened.

Figure 6:
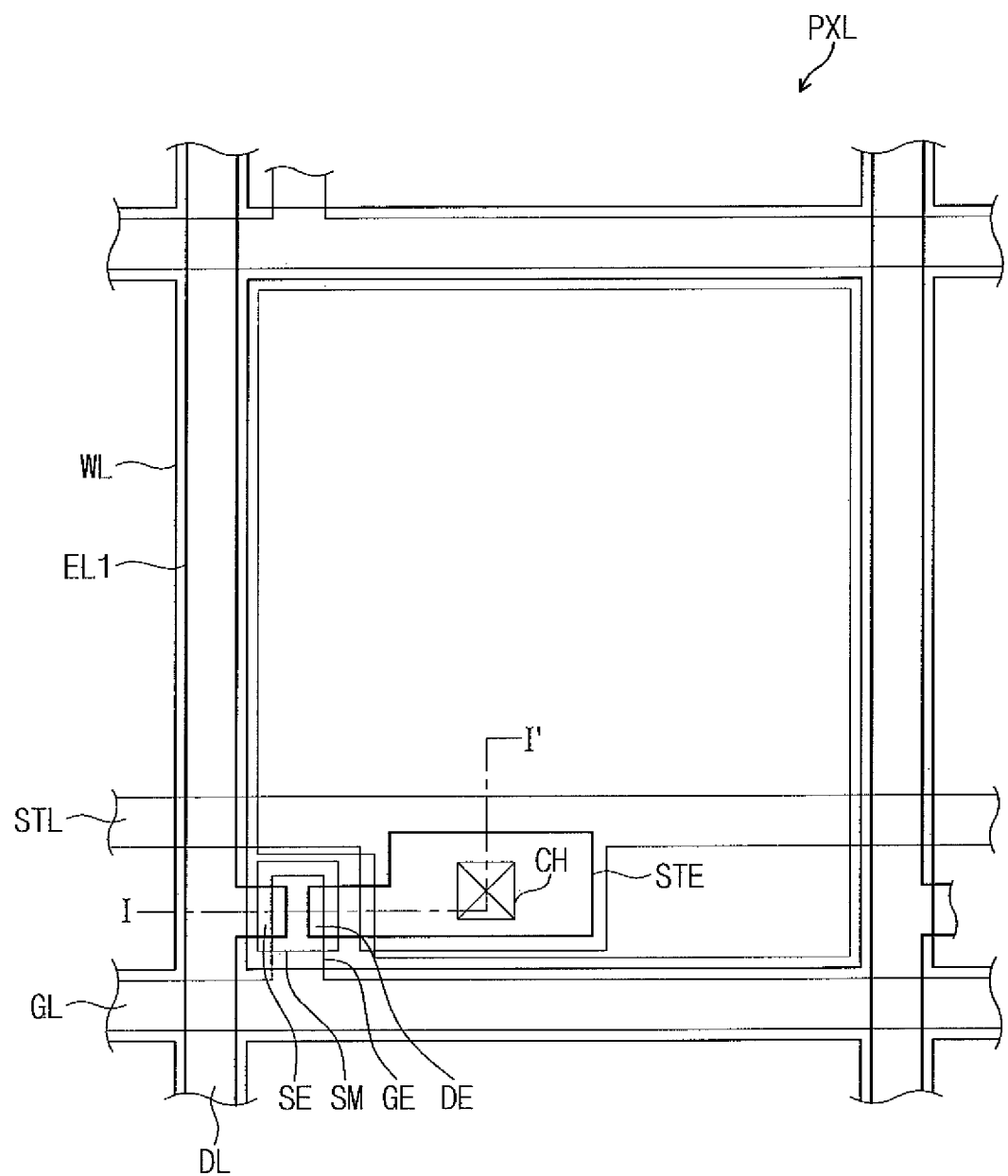
FIG. 6 is a plan view showing the electrowetting display device shown in FIG. 1 according to an exemplary embodiment of the present invention.
Figure 7:
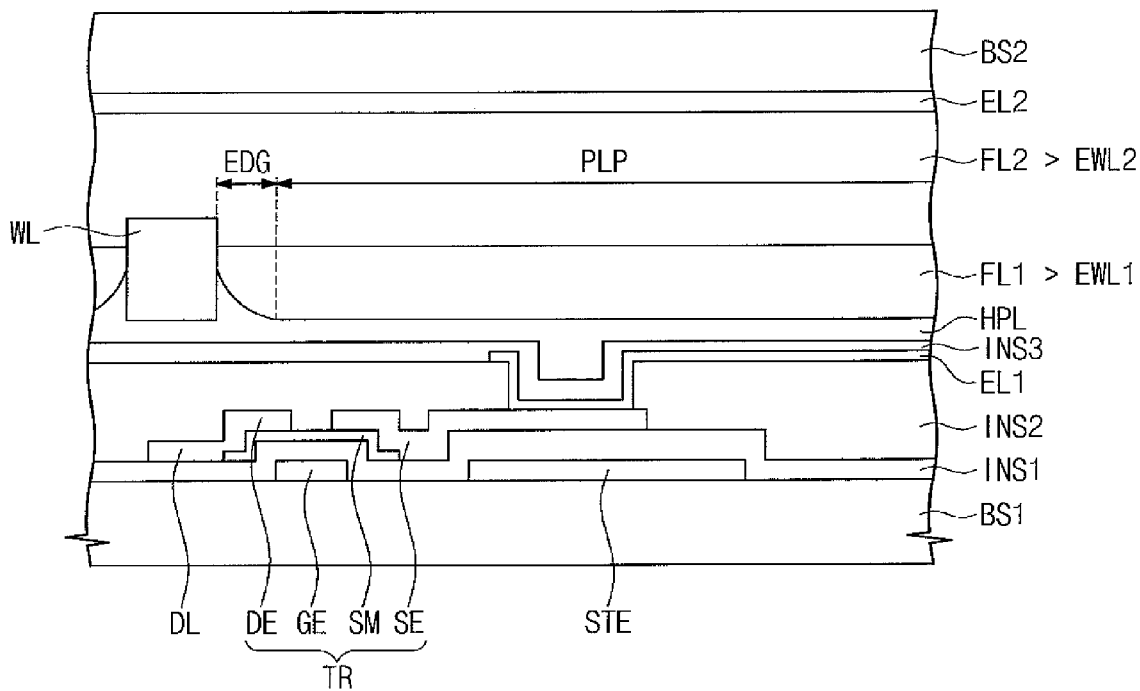
FIG. 7 is a cross-sectional view taken along a line I-I shown in FIG. 6.

FIG. 6 is a plan view showing the electrowetting display device shown in FIG. 1 according to an exemplary embodiment of the present invention and FIG. 7 is a cross-sectional view taken along a line I-I shown in FIG. 6. FIGS. 6 and 7 show two pixels PXL adjacent to each other. In the present exemplary embodiment, the range of each pixel PXL is an area between two walls WL adjacent to each other and the first fluid FL1 is limited in the pixel area PA.

Referring to FIGS. 6 and 7, the electrowetting display device includes, for example, a first substrate, a second substrate facing the first substrate, and the first and second electrowetting layers EWL1 and EWL2 are disposed between the first substrate and the second substrate.

The first substrate includes, for example, the first base substrate BS1, a plurality of gate lines GL disposed on the first base substrate BS1, and a plurality of data lines DL disposed on the first substrate BS1. The gate lines GL extend in, for example, a first direction and are formed on the first base substrate BS1. A first insulating layer INS1 is disposed on the first base substrate BS1 on which the gate lines GL are formed. The first insulating layer INS1 includes, for example, a silicon nitride, a silicon oxide, a silicon oxynitride, a tantalum oxide, an aluminum oxide, an alloy of carbon nitride or a mixture thereof. The data lines DL are formed, for example, on the first insulating layer INS1 and extend in a second direction crossing the first direction. It is noted that exemplary embodiments of the present invention are not limited to the above positions for the gate lines GL and the data lines DL. For example, alternatively, the data lines DL may instead be formed on the first base substrate BS1 and extend in the first direction and the gate lines GL may instead be formed on the first insulating layer INS1 and extend in the second direction crossing the first direction.

A thin film transistor TR is connected to a corresponding one of the gate lines GL and a corresponding one of the data lines DL. The thin film transistor TR includes, for example, a gate electrode GE, a semiconductor layer SM, a source electrode SE, and a drain electrode DE.

The gate electrode GE protrudes from the gate line GL. The gate electrode GE includes, for example, a conductive material like metal, such as, for example, copper (Cu), molybdenum (Mo), aluminum (Al), tungsten (W), chromium (Cr), titanium (Ti), nickel (Ni), gold (Au), palladium (Pd), platinum (Pt), neodymium (Nd), zinc (Zn), cobalt (Co), any mixtures thereof and any alloys thereof. In addition, the gate electrode GE may also be formed of other materials which include, for example, a transparent conductive material such as an indium tin oxide (ITO), an indium zinc oxide (IZO) and an aluminum doped zinc oxide (AZO).

The semiconductor layer SM is disposed on the gate electrode GE and the first insulating layer INS1 is disposed between the semiconductor layer SM and the gate electrode GE. The first insulating layer INS1 is disposed over the first base substrate BS1 to cover the gate line GL and the gate electrode GE.

The semiconductor layer SM includes, for example, an active layer disposed on the first insulating layer INS1 and an ohmic contact layer disposed on the active layer. The active layer is disposed in an area in which the source electrode SE and the drain electrode DE are formed and an area corresponding to between the source electrode SE and the drain electrode DE when viewed in a plan view. The active layer may include a silicon material such as, for example, amorphous silicon or polysilicon. Alternatively, the active layer may include, for example, an organic semiconductor material. The ohmic contact layer is disposed between the active layer and the source electrode SE and between the active layer and the drain electrode DE.

The ohmic contact layer may include, for example, amorphous silicon doped with n-type or p-type impurities. Alternatively, the ohmic contact layer may include, for example, an oxide semiconductor layer. For example, the ohmic contact layer may include an oxide semiconductor layer that includes one or more of the following elements: indium (In), gallium (Ga), zinc (Zn), tin (Sn), germanium (Ge), hafnium (Hf), and arsenide (As). For example, the ohmic contact layer may include, for example, zinc oxide (ZnO), tin oxide ($SnO_2$), indium oxide ($In_2O_3$), zinc stannate ($Zn_2SnO_4$), gallium oxide ($Ga_2O_3$), and hafnium oxide ($HfO_2$) in the oxide semiconductor layer.

The source electrode SE is branched from the data line DL and partially overlapped with the gate electrode GE when viewed in a plan view. The drain electrode DE is spaced apart from the source electrode SE and partially overlapped with the gate electrode GE when viewed in a plan view. The source electrode SE and the drain electrode DE include a conductive material, such as, for example, copper (Cu), molybdenum (Mo), aluminum (Al), tungsten (W), chromium (Cr), titanium (Ti), nickel (Ni), gold (Au), palladium (Pd), platinum (Pt), neodymium (Nd), zinc (Zn), cobalt (Co), any mixtures thereof and any alloys thereof. In addition, the source electrode SE and the drain electrode DE may also be formed of other materials which include, for example, a transparent conductive material such as an indium tin oxide (ITO), an indium zinc oxide (IZO) and an aluminum doped zinc oxide (AZO).

In the present exemplary embodiment, the source electrode SE and the drain electrode DE are overlapped with a portion of the semiconductor layer SM in an area except the area between the source electrode SE and the drain electrode DE. The area between the source electrode SE and the drain electrode DE serves as a channel portion, and an upper surface of the active layer is exposed through the area between the source and drain electrodes SE and DE. When the thin film transistor TR is turned on, a current may flow between the source electrode SE and the drain electrode DE through the channel portion.

A second insulating layer INS2 is disposed on the channel portion to cover and protect the channel portion. The second insulating layer INS2 includes, for example, silicon nitride, silicon oxide, silicon oxynitride, tantalum oxide, aluminum oxide, an alloy of carbon nitride or a mixture thereof. The second insulating layer INS2 covers a portion of the source electrode SE and a portion of the drain electrode DE.

The first electrode EL1 is connected to the drain electrode DE through a contact hole CH formed through the second insulating layer INS2 disposed between the first electrode EL1 and the drain electrode DE. A portion of the drain electrode DE is exposed through the contact hole CH and the first electrode EL1 is connected to the exposed portion of the drain electrode DE through the contact hole CH.

In the present exemplary embodiment, when the electrowetting display device is a transmission type electrowetting display device, the first electrode EL1 may include, for example, a transparent conductive material, such as indium tin oxide (ITO), indium zinc oxide (IZO), or indium tin zinc oxide (ITZO). In the case that the electrowetting display device is a reflection type electrowetting display device, the first electrode EL1 may include a conductive material having reflexibility, such as a metal material like, for example, aluminum. In addition, the first electrode EL1 may have, for example, a multi-layer structure using the transparent conductive material and the conductive material having reflexibility. Further, when the electrowetting display device is a transflective type electrowetting display device, the first electrode EL1 includes a reflective portion to reflect external light and a transmissive portion to transmit external light. In this case, the first electrode EL1 may have a single-layer structure or a multi-layer structure of the transparent conductive material and/or the conductive material having reflexibility.

The hydrophobic layer HPL is disposed on the first electrode EL1 to cover each pixel area PA.

In the present exemplary embodiment, a third insulating layer INS3 is disposed between the first electrode EL1 and the hydrophobic layer HPL. The third insulating layer INS3 includes an insulating material, such as, for example, silicon nitride (SiNx), silicon oxide (SiOx), silicon oxynitride, tantalum oxide, aluminum oxide, an alloy of carbon nitride or a mixture thereof. The third insulating layer INS3 may have a single-layer structure or a multi-layer structure.

The wall WL is disposed on the hydrophobic layer HPL of the first substrate. The wall WL restricts the movement of the first fluid FL1 and is provided in each pixel area PA. A spacer (not shown) may be provided on the second substrate to correspond to at least a portion of the wall WL. The spacer maintains a distance between the first substrate and the second substrate.

As described above, the hydrophobic layer HPL includes, for example, a material having hydrophobicity, e.g., a compound of fluorine atoms. The compound may contain, for example, about 49 at % of fluorine atoms or more in its surface to allow the surface to have hydrophobicity. The compound may be, for example, a polymer compound represented by the following chemical formulas, such as —CxFy-, CxFyHz-, —CxFyCzHp-, —CxFyO—, —CxFyN (H)—, etc., where each of x, y, x, p is an integer number equal to or larger than 1), or an amorphous fluorine compound, such as, for example, copolymers of tetrafluoroethylene (TFE) and perfluro-2,2 dimethyl 1,3 dioxide (PDD), sold under the brand name TEFLON®AF 1600 which is a registered trademark of the E.I. DuPont de Nemours and Company Corporation, 101 West 10th St., Wilmington, Del. 19898). Alternatively, other low surface energy polymers such as, for example, parylene may be used to form the hydrophobic layer HPL.

For example, the hydrophobic layer HPL contains about 49 at % of fluorine atoms in the surface thereof, and the contact angle of the water with respect to the hydrophobic layer HPL is about 100° or more. The hydrophobic layer HPL has a surface tension of, for example, about 16 dyne/cm or more.

The hydrophobic layer HPL includes, for example, a planarization portion PLP substantially parallel to the upper surface of the first base substrate BS1 and the edge portion EDG disposed at the side portions of the planarization portion PLP and inclined with respect to the wall WL. The planarization portion PLP has, for example, a thickness of about 10 nm or more to allow the hydrophobic layer HPL to have sufficient hydrophobicity when the hydrophobic layer HPL is formed. The surface of the edge portion EDG is bent upwardly as the edge portion EDG is closer to the wall WL. In other words, the end portion of the edge portion EDG may protrude upward from the planarization portion PLP to directly make contact with the wall WL. The contact angle of the hydrophobic layer HPL with respect to the wall WL is, for example, smaller than the right angle. The end portion of the edge portion EDG of the hydrophobic layer HPL is positioned, for example, at a height higher than a height of the end portion of the planarization portion PLP when viewed in a cross-sectional view. The height of the end portion of the edge portion EDG is, for example, lower than a height of the wall WL and larger than about 1/100 of the height of the wall WL. In addition, the height of the end portion of the edge portion EDG is, for example, smaller than about 99/100 of the height of the wall WL.

The second electrode EL2 is disposed on the second base substrate BS2 and applied with the common voltage. The second electrode EL2 includes, for example, the transparent conductive material, such as indium tin oxide, indium zinc oxide, or indium tin zinc oxide.

Although not shown in figures, either the first substrate or the second substrate includes, for example, color filters (not shown) to realize red, green, and blue colors. In addition, for example, a black matrix (not shown) may be provided between the color filters to block unnecessary light passing through between the color filters.

The first fluid FL1 and the second fluid FL2 are filled in between the first substrate and the second substrate. In FIG. 7, the first fluid FL1 has been shown in the OFF-state. In addition, in FIG. 7, a meniscus between the first fluid FL1 and the second fluid FL2 has been shown in a straight line shape, but the meniscus may be slightly bent upward or downward according to a filling process for the space and a type of the wall WL.

The electrowetting display device shown in FIGS. 6 and 7 may be manufactured by forming the electronic device on the base substrate, forming the hydrophobic layer HPL on at least a portion of the base substrate, plasma-treating the hydrophobic layer HPL, forming the wall WL on the hydrophobic layer HPL, reflowing the hydrophobic layer HPL, and forming the first and second electrowetting layers EWL1 and EWL2. That is, the method of manufacturing the electrowetting display device according to the present exemplary embodiment is substantially same as or similar to the method of manufacturing the electrowetting display device described with reference to FIGS. 3 and 4A to 4F.

For example, the method of manufacturing the electrowetting display device according to the present exemplary embodiment includes preparing the first base substrate BS1 and forming the switching device on the first base substrate BS1.

The gate electrode GE and the gate line GL are formed on the first base substrate BS1. The gate electrode GE and the gate line GL are formed by, for example, forming a conductive material, such as a metal material, on the first base substrate BS1 and patterning the conductive material using a photolithography process.

Then, the first insulating layer INS1, an amorphous silicon layer, and an n+ amorphous silicon layer are sequentially deposited on the first base substrate BS1 on which the gate electrode GE and the gate line GL are formed. When the amorphous silicon layer and the n+ amorphous silicon layer are selectively patterned by, for example, the photolithography process, the semiconductor layer SM, which includes the active layer and the ohmic contact layer that ohmic-contacts the source and drain electrodes SE and DE, is formed.

The conductive layer, such as a metal layer, is deposited on the first base substrate BS1 on which the semiconductor layer SM is formed, and the conductive layer is patterned using, for example, a photolithography process, thereby forming the data line DL, the source electrode SE, and the drain electrode DE.

The semiconductor layer SM, the source electrode SE, and the drain electrode DE may be formed by, for example, a two-time photolithography process, but exemplary embodiments of the present invention are not limited thereto or thereby. That is, the semiconductor layer SM, the source electrode SE, and the drain electrode DE may be formed by one-time photolithography process using a slit mask or a half-tone mask.

After that, the second insulating layer INS2 is formed on the first base substrate BS1 on which the source electrode SE and the drain electrode DE are formed. The second insulating layer INS2 is partially removed by, for example, a photolithography process to form the contact hole CH through which a portion of the drain electrode DE is exposed.

Then, when the transparent conductive material is deposited on the first base substrate BS1 and selectively patterned using a photolithography process, the first electrode EL1 is formed to be electrically connected to the drain electrode DE through the contact hole CH.

Next, the third insulating layer INS3 is formed on the first electrode EL1 and the hydrophobic layer HPL is formed on the third insulating layer INS3.

The hydrophobic layer HPL is plasma-treated, and then the wall WL is formed on the plasma-treated hydrophobic layer HPL by using, for example, a photolithography process.

Then, the plasma-treated hydrophobic layer HPL is, for example, reflowed.

The first and second electrowetting layers EWL1 and EWL2 are formed between the first substrate and the second substrate. The first electrowetting layer EWL1 may include, for example, the first fluid FL1 and the second electrowetting layer EWL2 may include, for example, the second fluid FL2. In the present exemplary embodiment, the first fluid FL1 is formed in the display area defined by the wall WL.

Figure 8:
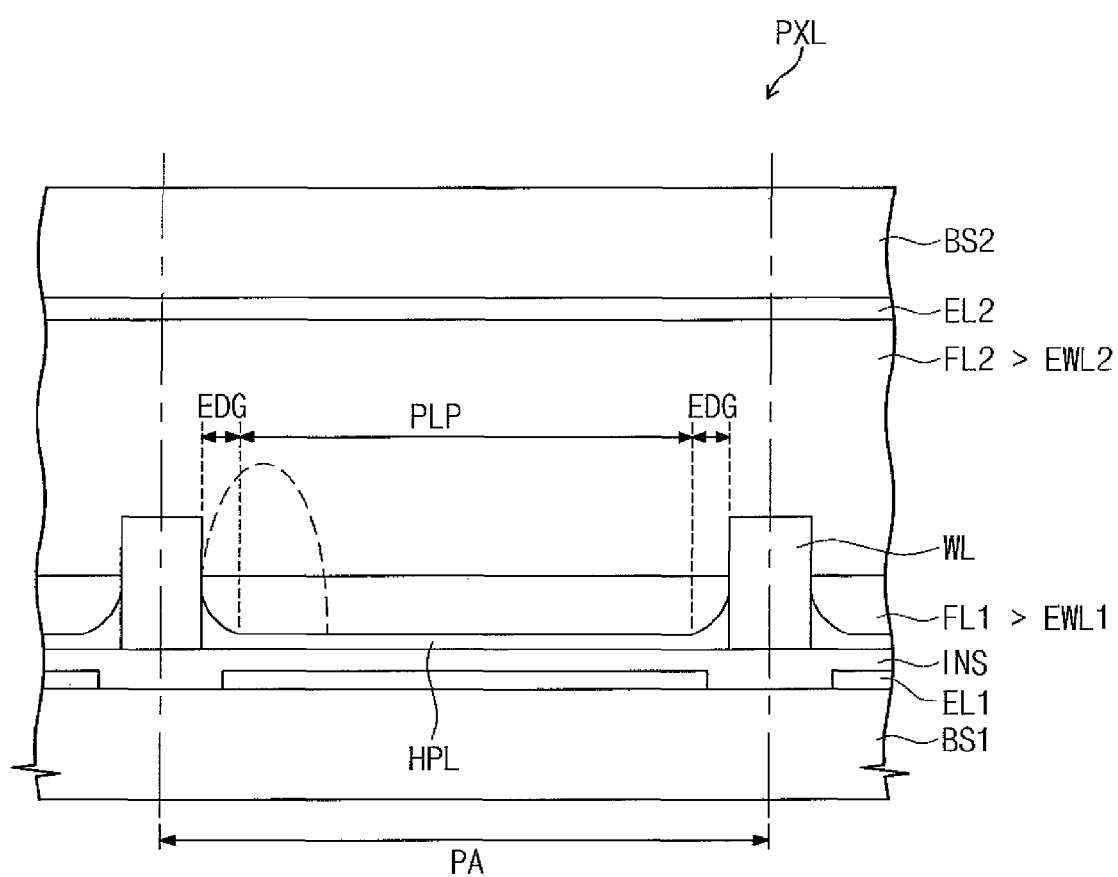
FIG. 8 is a cross-sectional view showing a portion of an electrowetting display device according to an exemplary embodiment of the present invention.

FIG. 8 is a cross-sectional view showing a portion of an electrowetting display device according to an exemplary embodiment of the present invention. The electrowetting display device includes a plurality of pixels PXL, and one of the pixels PXL has been shown in FIG. 8. In FIG. 8, a length of a side surface of the pixel PXL has been represented by two dotted lines.

Referring to FIG. 8, each pixel PXL includes, for example, a first base substrate BS1, a second base substrate BS2, a wall WL, a hydrophobic layer HPL, and a first electrowetting layer EWL1 and a second electrowetting layer EWL2.

The first base substrate BS1 and the second base substrate BS2 face each other and the first base substrate BS1 and the second base substrate BS2 may be, for example, a transparent insulating substrate. Each of the first base substrate BS1 and the second base substrate BS2 is formed, for example, in a single body to be commonly shared by the pixels PXL or formed in plural numbers to be used as a portion of each pixel PXL.

The wall WL is disposed on the first base substrate BS1 to define a space surrounded by the first base substrate BS1 and the wall WL. The space may be, for example, a pixel area PA corresponding to each pixel PXL. Accordingly, the area of the pixel area PA is limited by the wall WL, and the area of the pixel area PA has been represented by dotted lines.

The first and second electrowetting layers EWL1 and EWL2 are provided in the pixel area PA defined by the wall WL and the first substrate BS1 or the second substrate BS2. The first electrowetting layer EWL1 may include, for example, a first fluid FL1 and the second electrowetting layer EWL2 may include, for example, a second fluid FL2. The first and second fluids FL1 and FL2 are, for example, immiscible with each other. The first fluid FL1 may include, for example, pigments or dyes to display the color. For example, in an embodiment, the first fluid FL may include other dyes or pigments of primary colors such as red, green, cyan, magenta, blue, or yellow. Alternatively, in an embodiment, the first fluid FL may include a black dye or pigment.

The second fluid FL2 has, for example, an electrical conductivity or a polarity. For example, in an embodiment, the second fluid FL2 may be a polar liquid aqueous solution (Aq) such as, for example, water or a salt solution such as, for example, a solution of sodium chloride or potassium chloride in water. In the present exemplary embodiment, the second fluid FL2 includes, for example, potassium chloride or sodium chloride solution (Aq) dissolved in a mixture of water and ethyl alcohol. The second fluid FL2 may be, for example, transparent or have a color. As an example, the second fluid FL2 may have a white color to absorb or reflect light from the outside.

The hydrophobic layer HPL is disposed on the first base substrate BS1 in the display area defined by the wall WL. The hydrophobic layer HPL is provided in each pixel PXL to cover the pixel PXL and is separated from the hydrophobic layer HPL provided in an adjacent pixel PXL thereto by the wall WL. That is, the hydrophobic layer HPL is not formed between the wall WL and the first base substrate BS1 when viewed in a cross-sectional view.

Meanwhile, an insulating layer INS is disposed between the first base substrate 13S 1 and the hydrophobic layer HPL and between the first base substrate BS1 and the wall WL. The insulating layer NS may have, for example, a multi-layer structure, e.g., a double-layer structure, or may be omitted.

The hydrophobic layer HPL may have, for example, permeability or reflexibility. When the hydrophobic layer HPL has reflexibility, light from the outside may be reflected by the hydrophobic layer HPL. In addition, the hydrophobic layer HPL may, for example, have a white color or reflect a portion of the light corresponding to a specific wavelength to have a specific color.

The hydrophobic layer HPL includes, for example, a planarization portion PLP substantially parallel to the upper surface of the first base substrate BS1 and an edge portion EDG disposed at side portions of the planatization portion PLP and inclined with respect to the wall WL. The edge portion EDG is disposed adjacent to the wall WL to directly make contact with the wall WL.

Each pixel PXL includes, for example, an electronic device that applies an electric field to the first and second electrowetting layers EWL1 and EWL2 to control the first and second electrowetting layers EWL1 and EWL2. The electronic device includes, for example, a first electrode EL1 disposed on the first base substrate BS1, a switching device (not shown) connected to the first electrode EL1, and a second electrode EL2 disposed on the second base substrate BS2. The first electrode EL1 is disposed between the first base substrate BS1 and the hydrophobic layer HPL, and an insulating layer INS is disposed between the first base substrate BS1 and the first electrode EL1.

The first electrode EL1 is separated from the electrowetting layers EWL1 and EWL2 by the hydrophobic layer HPL. The first electrode EL1 may be provided in an arbitrary desired shape. The first electrode EL1 is applied with a voltage signal by the switching device. The second electrode EL2 may be formed, for example, in a single body to cover all the pixels PXL. Although not shown in figures, in the case that the second electrode EL2 is divided into a plurality of second electrodes EL2, which respectively correspond to the pixels PXL, the second electrodes EL2 may be electrically connected to each other by the second fluid FL2.

In the present exemplary embodiment, the first electrode EL1 and the second electrode EL2 are respectively disposed on the first base substrate BS1 and the second base substrate B 52, but exemplary embodiments of the present invention are not limited thereto or thereby. For instance, all the first and second electrodes EL1 and EL2 may be disposed on the first base substrate BS1. In this case, the second electrode EL2 may be provided on at least one side portion of the first electrode EL1 and electrically insulated from the first electrode EL1.

The pixel PXL may be controlled by a voltage V applied between the first electrode EL1 and the second electrode EL2. The first electrode EL1 disposed on the first base substrate BS1 is connected to the switching device.

The movement of the first fluid FL1 may be limited in each pixel PXL by the wall WL of the pixel PXL. The wall WL may have hydrophilicity to push out the first fluid FL1. In the present exemplary embodiment, the wall WL extends in a direction from the first base substrate BS1 to the second base substrate BS2. However, exemplary embodiments of the present invention are not limited to this positioning of the wall WL. For example, alternatively, in an embodiment, the wall WL may extend in a direction from the second base substrate BS2 to the first base substrate BS1.

The pixel PXL may be in an ON-state when the voltage difference, which is not zero, is applied to the first electrode FL1 and the second electrode FL2. An electrostatic force caused by the voltage difference may move the second fluid FL2 to the first electrode ED, and thus the first fluid FL1 may be pushed out from at least a portion of the hydrophobic layer HPL to the wall WL surrounding the hydrophobic layer HPL. When the first fluid FL1 is completely pushed out, the first fluid FL1 may have a drop shape as shown by the dotted line. Accordingly, the hydrophobic layer HPL of the pixel PXL is exposed through the first fluid FL1. When the voltage applied to the pixel PXL returns to about zero volts, the pixel PXL may return to an OFF-state, so the first fluid FL1 covers the hydrophobic layer HPL again. The first fluid FL1 may thus serve as an optical switch that is able to be electrically controlled in each pixel PXL.

Figure 9:
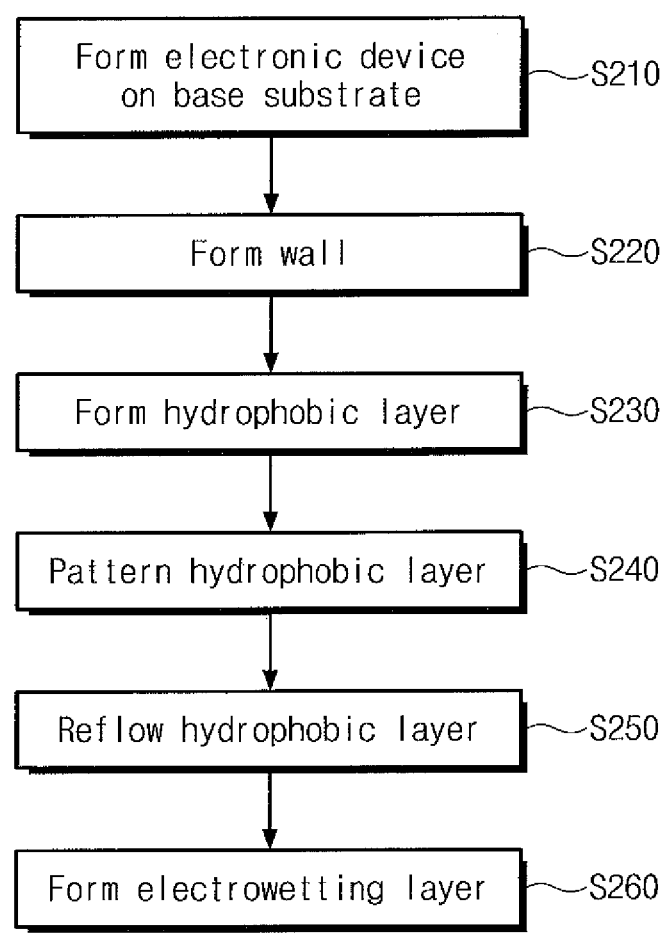
FIG. 9 is a flowchart showing a method of manufacturing an electrowetting display device shown in FIG. 8 according to an exemplary embodiment of the present invention.

FIG. 9 is a flowchart showing a method of manufacturing an electrowetting display device shown in FIG. 8 according to an exemplary embodiment and FIGS. 10A to 10E are cross-sectional views showing a method of manufacturing the electrowetting display device shown in FIG. 1 according to an exemplary embodiment of the present invention.

For example, referring to FIG. 9, the electrowetting display device is manufactured by forming the electronic device on the base substrate, forming the hydrophobic layer HPL on at least a portion of the base substrate, patterning the hydrophobic layer HPL, reflowing the hydrophobic layer HPL, and forming the first electrowetting layer EWL1 and the second electrowetting layer EWL2.

Hereinafter, the method of manufacturing the electrowetting display device will be described in detail with reference to FIGS. 9 and 10A to 10F.

Figure 10A:
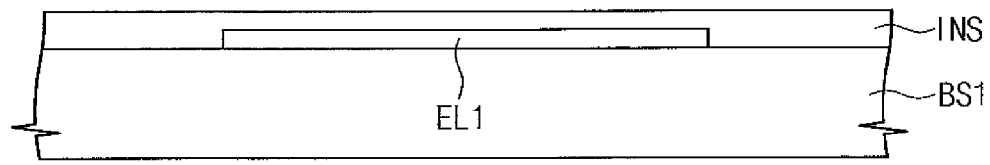
FIGS. 10A to 10F are cross-sectional views showing a method of manufacturing the electrowetting display device shown in FIG. 1 according to an exemplary embodiment of the present invention.

Referring to FIGS. 9 and 10A, the base substrate is prepared and the electronic device is formed on the base substrate (S210).

The base substrate includes, for example, the first base substrate BS1 and the second base substrate BS2. In FIG. 10A, only the first base substrate BS1 is shown and the second base substrate BS2 is omitted.

The electronic device includes the first electrode EL1, the second electrode EL2, and the switching device. For the convenience of explanation, only the first electrode EL1 of the electronic device is shown in FIG. 10A. The switching device is connected to the first electrode EL1 and includes, for example, a transistor, capacitor, and a connection line. The electronic device is formed, for example, either only on the first base substrate BS1 or on both of the first and second base substrates BS1 and BS2. In the present exemplary embodiment, the first electrode EL1 and the switching device are formed on the first base substrate BS1, and the second electrode EL2 is formed on the second base substrate BS2. The insulating layer INS is formed on the electronic device.

Figure 10B:
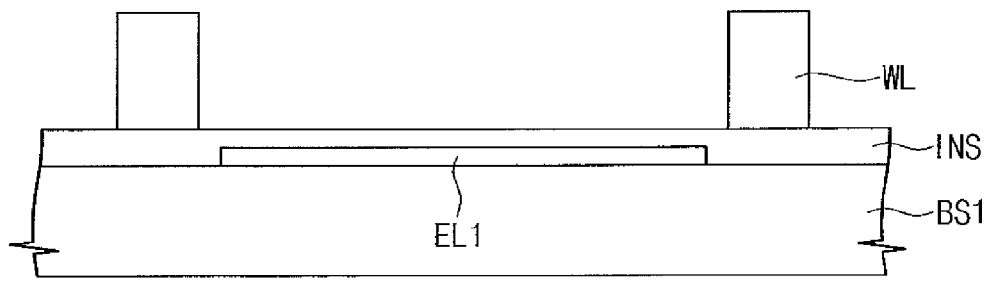

Referring to FIGS. 9 and 10B, the wall WL is formed on the insulating layer INS (S220). The wall WL may be formed of, for example, a photosensitive organic material, such as a photoresist, or a heat curable organic material. The wall WL may include, for example, an epoxy compound represented by the chemical formula 2.

In the case that the wall WL is formed of the photosensitive organic material, the wall WL may be formed, for example, by a photolithography process including exposure and development processes. For example, the photosensitive organic material is patterned through the photolithography process and cured through a baking process, thereby forming the wall WL with the photosensitive organic material.

Figure 10C:
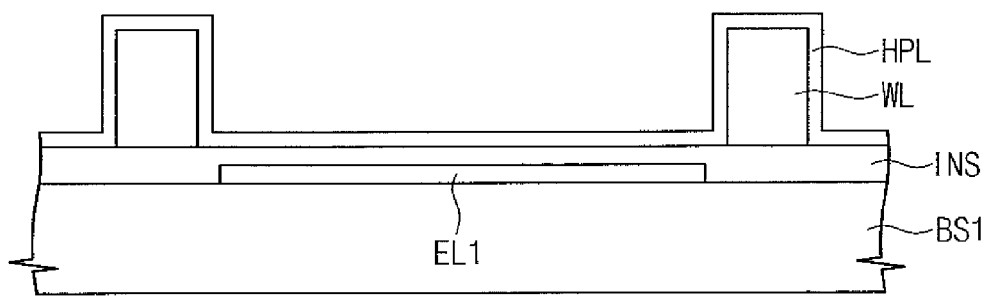
Figure 10D:
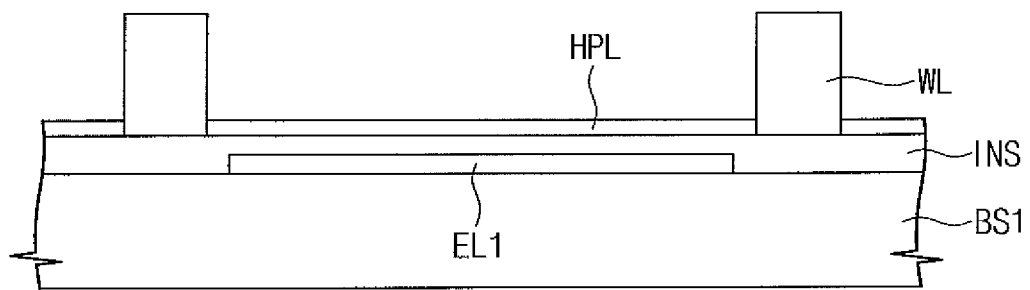

Referring to FIGS. 9 and 10C, the hydrophobic layer HPL is formed on the insulating layer INS on which the wall WL is formed (S230). The hydrophobic layer HPL is formed to cover the upper surface of the insulating layer INS and the wall WL.

The hydrophobic layer HPL is formed, for example, by using a compound containing fluorine atoms. The compound of the hydrophobic layer HPL may be, for example, a polymer compound, such as —$C_xF_y$-, $C_xF_yH_z$-, —$C_xF_y$-$C_zH_p$-, —$C_xF_yO$—, —$C_xF_yN(H)$—, etc., (where each of x, y, x, p is an integer number equal to or larger than 1), or the amorphous fluorine compound represented by the chemical formula 1, such as, for example, copolymers of tetrafluoroethylene (TFE) and perfluro-2,2 dimethyl 1,3 dioxide (PDD), sold under the brand name TEFLON® AF 1600 which is a registered trademark of the E.I. DuPont de Nemours and Company Corporation, 101 West 10th St., Wilmington, Del. 19898). Alternatively, other low surface energy polymers such as, for example, parylene may be used to form the hydrophobic layer HPL.

Then, although not shown in figures, the hydrophobic layer HPL is patterned to be remain only on the insulating layer INS (S240). Selectively, only the hydrophobic layer HPL formed on the upper surface of the wall WL is removed and the hydrophobic layer HPL formed on the side surface of the wall WL and on the insulating layer INS remains. The patterning of the hydrophobic layer HPL is performed by, for example, a photolithography process using a photoresist and the remaining photoresist is removed by a dry etch process. In addition, the patterning is performed to expose a portion of the electronic device, e.g., a portion of the connection line, and thus external lines may be connected to the electronic device.

The plasma-treatment performed to increase the adhesive property of the hydrophobic layer HPL is omitted. This is because the hydrophobic layer HPL is formed after the wall WL is formed.

Figure 10E:
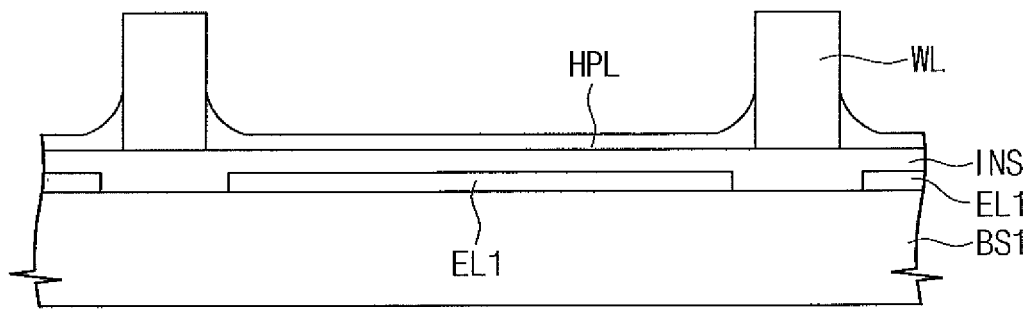

Referring to FIGS. 9 and 10E, the hydrophobic layer HPL is, for example, reflowed (S250). Residues and hydrophilic functional groups (e.g., —OH, —CHO, —COOH, etc.) on the hydrophobic layer HPL are removed through the reflowing process, so that the hydrophobicity on the surface of the hydrophobic layer HPL may be increased. The residues and hydrophilic functional groups are generated in the process of forming the wall WL. The reflow process is performed, for example, by heating the hydrophobic layer HPL at a temperature higher than a glass transition temperature Tg of the material for the hydrophobic layer HPL. The reflow temperature of the hydrophobic layer HPL is in a range of, for example, about 160° C. to about 280° C. When the hydrophobic layer HPL is formed of the organic material represented by the chemical formula 1, the reflow process is performed at the reflow temperature of, for example, about 160° C. or more. For example, in an embodiment, the reflow process may be performed at the reflow temperature of about 220° C. for about one hour. In the reflow process, the atoms in the hydrophobic layer HPL may be rearranged so as to allow an interfacial energy between the hydrophobic layer HPL and air to be minimized. Thus, the hydrophilic functional groups may enter inside the hydrophobic layer HPL and hydrophobic functional groups, e.g., fluorine (F), may come up to the surface. As a result, the hydrophobicity of the hydrophobic layer HPL may be strengthened again.

In the reflow process, a creep phenomenon, in which the surface of the edge portion EDG slides upward along the wall WL as it is closer to the wall WL, may occur when the reflow temperature is equal to or higher than the glass transition temperature and a surface tension difference between the hydrophobic layer HPL and the wall WL is equal to or higher than gravity. In this case, the height of the end portion of the edge portion EDG may be varied depending on, for example, the temperature, the process time, and the surface tension of the wall WL and the hydrophobic layer HPL of the reflow process. For example, when the hydrophobic layer HPL is represented by the chemical formula 1 and the wall WL is represented by the chemical formula 2, the surface tension of the hydrophobic layer HPL is about 17 dyne/cm and the surface tension of the wall WL is about 45 dyne/cm. The height of the end portion of the edge portion EDG may be varied depending on, for example, the temperature, the process time, and the surface tension of the wall WL and the hydrophobic layer HPL of the reflow process.

Figure 10F:
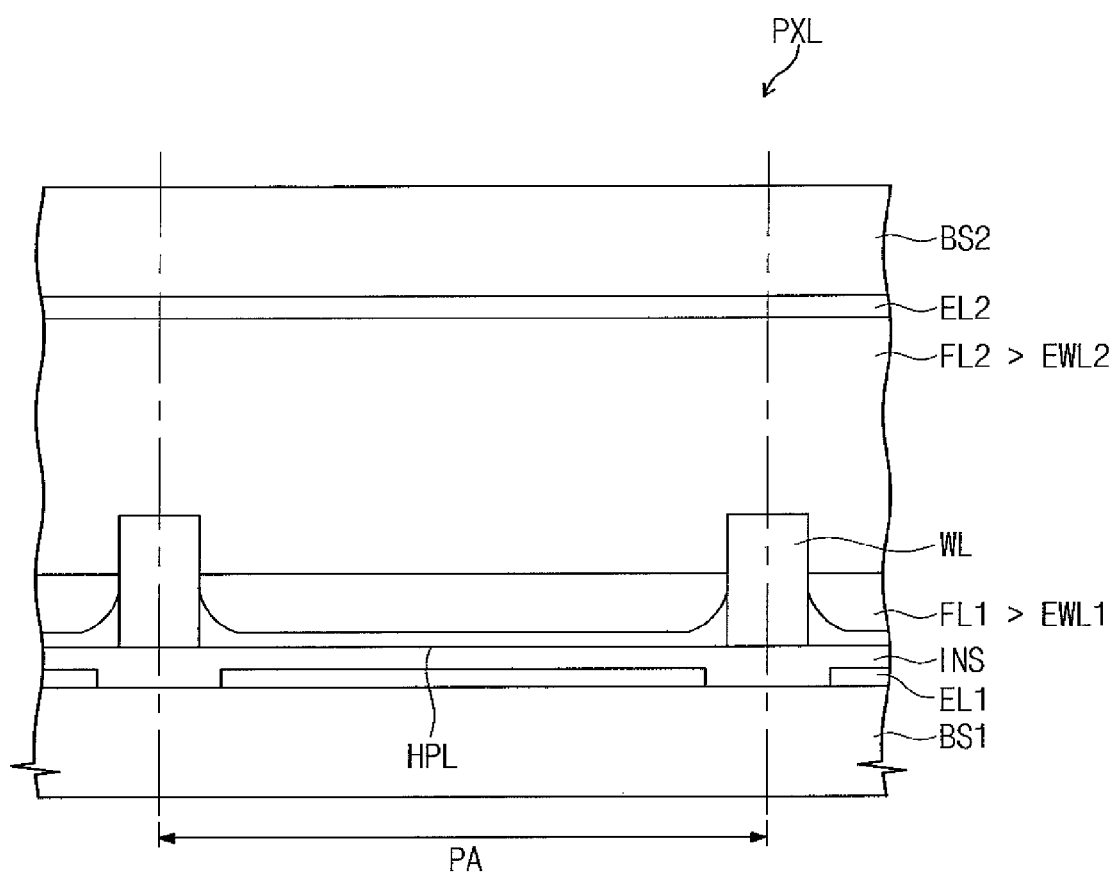

Referring to FIGS. 9 and 10F, the first and second electrowetting layers EWL1 and EWL2 are formed between the first base substrate BS1 and the second base substrate BS2 (S260). The first electrowetting layer EWL1 may include, for example, the first fluid FL1 and the second electrowetting layer EWL2 may include, for example, the second fluid FL2. In the present exemplary embodiment, the first fluid FL1 is formed in the display area defined by the wall WL.

The electrowetting display device manufactured by the above-mentioned method may reduce a non-closing defective when the electrowetting display device is operated. According to the present exemplary embodiment, the hydrophobicity of the hydrophobic layer HPL may be strengthened by reflowing the hydrophobic layer HPL to which the hydrophilic functional groups are adsorbed. That is, during the reflow process, the atoms in the hydrophobic layer HPL may be rearranged so as to allow the interfacial energy between the hydrophobic layer HPL and air to be minimized. Thus, the hydrophilic functional groups may be transported inside the hydrophobic layer HPL and hydrophobic functional groups, e.g., fluorine (F), may be transported up to the surface of the hydrophobic layer HPL. As a result, the hydrophobicity of the hydrophobic layer HPL is strengthened and the non-closing defective may be reduced.

Figure 11:
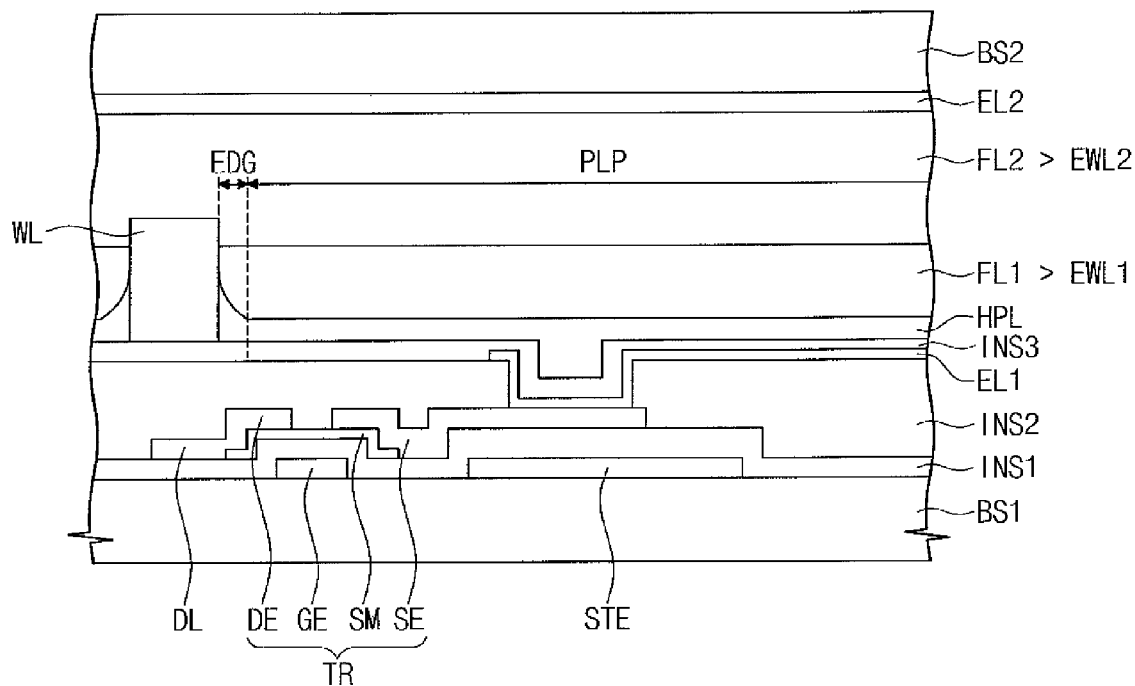
FIG. 11 is a cross-sectional view showing an electrowetting display device according to an exemplary embodiment of the present invention.

FIG. 11 is a cross-sectional view showing an electrowetting display device according to an exemplary embodiment of the present invention shown in FIG. 8. The cross-sectional view of the electrowetting display device shown in FIG. 11 corresponds to the cross-sectional view taken along the line I-I' of FIG. 6. In FIG. 11, the range of each pixel PXL is an area between two walls WL adjacent to each other and the first fluid FL1 is limited in the pixel area PA.

The electrowetting display device shown in FIG. 11 is manufactured, for example, by forming an electronic device on a base substrate, forming a wall WL on the base substrate, forming a hydrophobic layer HPL on the base substrate, reflowing the hydrophobic layer HPL, and forming a first electrowetting layer EWL1 and a second electrowetting layer EWL2. In the present exemplary embodiment, the process of forming the electronic device on the base substrate is substantially same as that of the method described with reference to FIG. 6. Thus, detailed descriptions of the method of manufacturing the electrowetting display device according to the present exemplary embodiment will be omitted.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An electrowetting display device comprising:
a base substrate;
a hydrophobic parylene layer disposed on the base substrate;
a wall disposed on the base substrate which partitions a pixel area;
an electrowetting layer that includes a first fluid and a second fluid, wherein the first fluid and the second fluid are disposed in the pixel area and are immiscible with each other, wherein the second fluid has an electrical conductivity or a polarity; and
an electronic device configured to apply an electric field to the electrowetting layer to control the electrowetting layer; and
wherein the hydrophobic parylene layer includes:
a planarization portion substantially parallel to an upper surface of the base substrate and having a substantially constant thickness, and
an edge portion formed by creep at temperatures equal to or greater than a glass transition temperature of the hydrophobic parylene layer, wherein a thickness of the edge portion is greater than the substantially constant thickness of the planarization portion and the thickness of the edge portion increases as a distance to the wall decreases.

2. The electrowetting display device of claim 1, wherein the wall is disposed on the hydrophobic parylene layer.

3. The electrowetting display device of claim 1, wherein the hydrophobic parylene layer is disposed in the pixel area.

4. The electrowetting display device of claim 1, wherein the edge portion is disposed along a periphery of the planarization portion.

5. The electrowetting display device of claim 4, wherein the height of an end portion of the edge portion of the hydrophobic parylene layer is larger than about $1/100$ of the height of the wall, and wherein the height of the end portion of the edge portion of the hydrophobic parylene layer is smaller than about $99/100$ of the height of the wall.

6. The electrowetting display device of claim 4, wherein a height of the planarization portion is higher than a height of the edge portion of the hydrophobic parylene layer when viewed in a cross-sectional view, and wherein the planarization portion has a thickness of at least about 10 nm.

7. The electrowetting display device of claim 1, wherein the electronic device comprises:

a switching device disposed on the base substrate;
a first electrode connected to the switching device; and
a second electrode spaced apart from the first electrode to form the electric field.

8. The electrowetting display device of claim 7, further comprising an opposite substrate facing the base substrate, wherein the second electrode is disposed on the opposite substrate.

9. The electrowetting display device of claim 7, wherein the second electrode is formed on the base substrate.

10. The electrowetting display device of claim 7, wherein the first electrode is separated from the electrowetting layer by the hydrophobic parylene layer.

11. The electrowetting display device of claim 1, wherein the hydrophobic parylene layer is permeable.

12. The electrowetting display device of claim 1, wherein the hydrophobic parylene layer has a white color.

13. An electrowetting display device comprising:
a base substrate;
a hydrophobic parylene layer disposed on the base substrate;
a pixel wall disposed on the hydrophobic parylene layer, wherein the pixel wall at least partially encloses a pixel area and partitions the pixel area from adjacent pixel areas, and wherein the hydrophobic parylene layer has a substantially constant thickness over a central portion of the pixel area and a varying thickness over a peripheral portion of the pixel area adjacent to the pixel wall;
an electrowetting layer that includes a first fluid and a second fluid, wherein the first fluid and the second fluid are immiscible with each other, and wherein the second fluid has an electrical conductivity or a polarity; and
an electronic device configured to apply an electric field to the electrowetting layer.

14. The electrowetting display device of claim 13, wherein the hydrophobic parylene layer comprises (i) a planarization portion substantially parallel to an upper surface of the base substrate and having the substantially constant thickness and (ii) an edge portion having the varying thickness and disposed at side portions of the planarization portion.

15. The electrowetting display device of claim 14, wherein a height of the planarization portion is higher than a height of the edge portion of the hydrophobic parylene layer when viewed in a cross-sectional view, and wherein the planarization portion has a thickness of at least about 10 nm.

16. The electrowetting display device of claim 13, wherein the electronic device comprises:
a switching device disposed on the base substrate;
a first electrode connected to the switching device; and
a second electrode spaced apart from the first electrode by at least the electrowetting layer.

17. The electrowetting display device of claim 16, further comprising an opposite substrate facing the base substrate, wherein the second electrode is disposed on the opposite substrate.

18. The electrowetting display device of claim 16, wherein the second electrode is formed on the base substrate.

19. The electrowetting display device of claim 16, wherein the first electrode is separated from the electrowetting layer by the hydrophobic parylene layer.

* * * * *